(12) United States Patent
Seo et al.

(10) Patent No.: US 12,219,808 B2
(45) Date of Patent: Feb. 4, 2025

(54) DISPLAY APPARATUS HAVING A PLURALITY OF DISPLAY AREAS

(71) Applicant: Samsung Display Co., Ltd., Yongin-si (KR)

(72) Inventors: Youngwan Seo, Yongin-si (KR); Gyungsoon Park, Yongin-si (KR); Sumi Lee, Yongin-si (KR); Jaeun Lee, Yongin-si (KR); Gunhee Kim, Yongin-si (KR); Hyeongseok Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 726 days.

(21) Appl. No.: 17/351,923

(22) Filed: Jun. 18, 2021

(65) Prior Publication Data
US 2021/0399060 A1    Dec. 23, 2021

(30) Foreign Application Priority Data

Jun. 18, 2020 (KR) .......................... 10-2020-0074442

(51) Int. Cl.
| | |
|---|---|
| *H10K 59/121* | (2023.01) |
| *H10K 59/126* | (2023.01) |
| *H10K 59/122* | (2023.01) |
| *H10K 59/124* | (2023.01) |
| *H10K 59/35* | (2023.01) |

(52) U.S. Cl.
CPC ......... *H10K 59/121* (2023.02); *H10K 59/126* (2023.02); *H10K 59/122* (2023.02); *H10K 59/124* (2023.02); *H10K 59/353* (2023.02)

(58) Field of Classification Search
None
See application file for complete search history.

(56) References Cited

U.S. PATENT DOCUMENTS

| | | | |
|---|---|---|---|
| 2019/0305057 A1* | 10/2019 | Cheng | ................. H10K 59/352 |
| 2020/0098308 A1 | 3/2020 | Li | |
| 2022/0216272 A1* | 7/2022 | Zhang | ................. H10K 59/352 |

FOREIGN PATENT DOCUMENTS

| | | |
|---|---|---|
| CN | 109001934 A | 12/2018 |
| CN | 110444125 A | 11/2019 |
| CN | 110504289 A | 11/2019 |
| CN | 110619813 A | 12/2019 |

\* cited by examiner

*Primary Examiner* — Suberr L Chi
(74) *Attorney, Agent, or Firm* — Lewis Roca Rothgerber Christie LLP

(57) ABSTRACT

A display apparatus includes: a first display area comprising a first plurality of pixels; a second display area comprising transmission areas and a second plurality of pixels, wherein: the second plurality of pixels of the second display area are arranged in a buffer display area and a normal display area of the second display area; the buffer display area is adjacent to the first display area; the normal display area is spaced apart from the first display area; and a pixel density of the normal display area is less than a pixel density of the buffer display area; and a blocking metal layer in the second display area and comprising openings corresponding to the transmission areas.

14 Claims, 23 Drawing Sheets

DISPLAY APPARATUS HAVING A PLURALITY OF DISPLAY AREAS

CROSS-REFERENCE TO RELATED APPLICATION

The present application claims priority to and the benefit of Korean Patent Application No. 10-2020-0074442, filed on Jun. 18, 2020, in the Korean Intellectual Property Office, the entire disclosure of which is incorporated by reference herein.

BACKGROUND

1. Field

Aspects of one or more example embodiments relate to a display apparatus and an electronic device including the same.

2. Description of Related Art

Recently, display apparatuses have been utilized for various purposes. Also, as thicknesses and weights of display apparatuses have decreased, the range of applications of display apparatuses has increased.

As an area occupied by a display area in a display apparatus has increased, various functions linked to or associated with the display apparatus have increased.

The above information disclosed in this Background section is only for enhancement of understanding of the background and therefore the information discussed in this Background section does not necessarily constitute prior art.

SUMMARY

In order to increase the area of a display area and add various functions, aspects of some example embodiments include a display apparatus having an area, inside the display area, for adding various functions other than an image display function. In order to add various functions, an arrangement of pixels in a display area may be variously designed. One or more example embodiments may include a display apparatus including a design structure of pixels located in a display area and an electronic device including the display apparatus.

Additional aspects of some example embodiments will be set forth in part in the description which follows and, in part, will be more apparent from the description, or may be learned by practice of the presented embodiments.

According to one or more example embodiments, a display apparatus includes a first display area including a plurality of pixels, a second display area including transmission areas and a plurality of pixels, wherein the plurality of pixels of the second display area are arranged in a buffer display area and a normal display area of the second display area, a buffer display area is adjacent to the first display area, a normal display area is far from the first display area, and a pixel density of the normal display area is less than a pixel density of the buffer display area, and a blocking metal layer located in the second display area and including openings corresponding to the transmission areas.

According to some example embodiments, per unit area, an aperture ratio or a number of pixels in the buffer display area may be greater than an aperture ratio or a number of pixels in the normal display area, and less than an aperture ratio or a number of pixels in the first display area.

According to some example embodiments, the normal display area of the second display area may include a first transmission area among the transmission areas, the first transmission area being between two pixel groups that are spaced apart from each other, and the blocking metal layer may include a first opening among the openings, the first opening corresponding to the first transmission area of the normal display area.

According to some example embodiments, the buffer display area of the second display area may include a second transmission area among the transmission areas, the second transmission area being between two pixel groups that are spaced apart from each other, and the blocking metal layer may include a second opening among the openings, the second opening corresponding to the second transmission area of the buffer display area.

According to some example embodiments, a density of the first transmission area of the normal display area may be greater than a density of the second transmission area of the buffer display area.

According to some example embodiments, the buffer display area of the second display area may include two pixel groups that are spaced apart from each other, and the blocking metal layer may include a metal material portion corresponding to a region between the two pixel groups of the buffer display area.

According to some example embodiments, an arrangement of the plurality of pixels in the second display area may be different from an arrangement of the plurality of pixels in the first display area.

According to some example embodiments, a shape of each of the transmission areas in a plan view may be substantially same as a shape of each of the openings of the blocking metal layer.

According to one or more example embodiments, a display apparatus includes a first display area including a plurality of pixels, a second display area including transmission areas and a plurality of pixel groups that are spaced apart from one another, and a blocking metal layer including openings corresponding to the transmission areas, wherein the second display area includes a buffer display area located adjacent to the first display area and a normal display area located far from the first display area, wherein a first distance between the first display area and a first pixel group of the buffer display area closest to the first display area is less than a second distance between a second pixel group and a third pixel group adjacent to each other in the normal display area.

According to some example embodiments, the normal display area may include a first transmission area between the second pixel group and the third pixel group, and the blocking metal layer may include a first opening corresponding to the first transmission area of the normal display area.

According to some example embodiments, the first opening of the blocking metal layer may have a first width, and the first width may be equal to or less than the second distance.

According to some example embodiments, the buffer display area may include a second transmission area having a second width and located between the first pixel group and the first display area.

According to some example embodiments, the blocking metal layer may include a second opening corresponding to the second transmission area and having a second width, wherein the second width of the second opening is less than the first width of the first opening.

According to some example embodiments, the blocking metal layer may include a metal material portion overlapping a region between the first display area and the first pixel group of the buffer display area.

According to some example embodiments, shapes of the transmission areas in a plan view may be substantially same as shapes of the openings of the blocking metal layer corresponding to the transmission areas.

According to one or more example embodiments, a display apparatus includes a first display area including a plurality of pixels, and a second display areas including transmission areas and a plurality of pixel groups that are spaced apart from one another, wherein the second display area includes a buffer display area located adjacent to the first display area and a normal display area located far from the first display area, pixels of the first display area adjacent to the second display area are arranged to have a zigzag configuration in a plan view, and a first pixel group of the buffer display area closest to the first display area is spaced apart by a first distance from the first display area.

According to some example embodiments, the first distance may be less than a second distance between a second pixel group and a third pixel group adjacent to each other in the normal display area.

According to some example embodiments, the display apparatus may further include a blocking metal layer including openings corresponding to the transmission areas.

According to some example embodiments, the normal display area may include a first transmission area between the second pixel group and the third pixel group, and the blocking metal layer may include a first opening corresponding to the first transmission area.

According to some example embodiments, the first opening of the blocking metal layer may have a first width, and the first width may be equal to or less than the second distance.

According to some example embodiments, the blocking metal layer may include a metal material portion overlapping a region between the first display area and the first pixel group.

According to some example embodiments, shapes of the transmission areas in a plan view may be substantially same as shapes of the openings of the blocking metal layer corresponding to the transmission areas.

Other aspects, features, and characteristics of embodiments according to the present disclosure will become more apparent from the drawings, the claims, and the detailed description.

BRIEF DESCRIPTION OF THE DRAWINGS

The above and other aspects, features, and characteristic of certain example embodiments will be more apparent from the following description taken in conjunction with the accompanying drawings, in which.

DETAILED DESCRIPTION

Figure 1A:
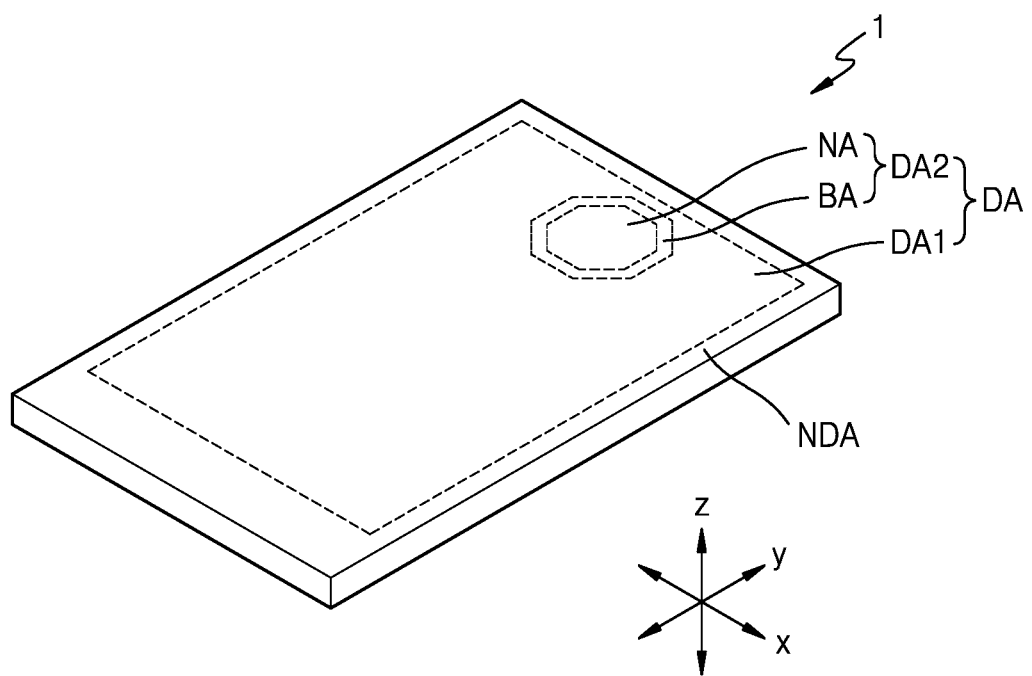
FIGS. 1A and 1B are perspective views each illustrating an electronic device including a display apparatus according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, aspects of some example embodiments will be illustrated in the drawings and described in more detail in the written description. The effects and characteristics of embodiments according to the present disclosure and the accompanying methods thereof will become apparent from the following description of the embodiments, taken in conjunction with the accompanying drawings. However, embodiments according to the present disclosure are not limited to the embodiments described below, and may be embodied in various modes.

Reference will now be made in more detail to some example embodiments, which are illustrated in the accompanying drawings, and in the drawings, the same elements are denoted by the same reference numerals and a repeated explanation will be omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being "on" another layer, region, or element, it may be directly on the other layer, region, or element or may be indirectly on the other layer, region, or element with intervening layers, regions, or elements therebetween.

When a certain embodiment may be implemented differently, a specific process order may be different from the described order. For example, two consecutively described processes may be performed substantially at the same time or performed in an order opposite to the described order.

It will be understood that when a layer, region, or element is referred to as being "connected," the layer, the region, or the element may be directly connected or may be indirectly connected with intervening layers, regions, or elements therebetween. For example, when a layer, a region, or an element is electrically connected, the layer, the region, or the element may be directly electrically connected or may be indirectly electrically connected with intervening layers, regions, or elements therebetween.

Figure 1B:
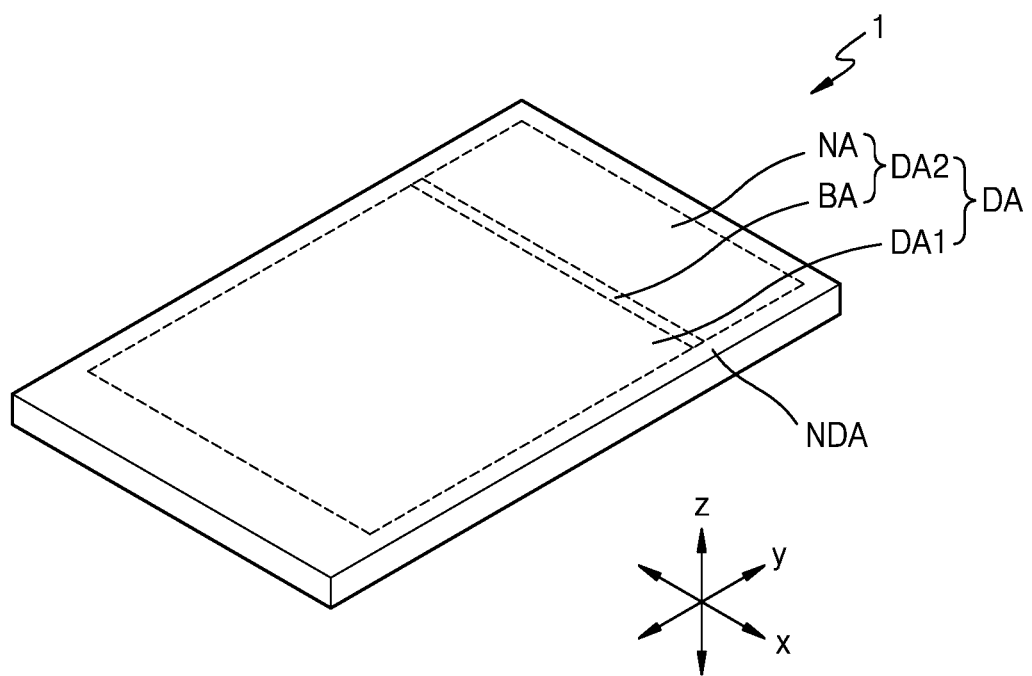

FIGS. 1A and 1B are perspective views each illustrating an electronic device including a display apparatus according to some example embodiments.

Referring to FIGS. 1A and 1B, an electronic device 1 may include a display area DA and a non-display area NDA outside of the display area DA (e.g., in a periphery of, or outside a footprint of, the display area DA). The display area DA may include a first display area DA1 including a first plurality of pixels, and a second display area DA2 including a second plurality of pixels. According to some example embodiments, the second display area DA2 may include a normal display area NA and a buffer display area BA. According to some example embodiments, the buffer display area BA may surround the normal display area NA. The electronic device 1 may provide or display images through an array of pixels (e.g., the first plurality of pixels and the second plurality of pixels) arranged in the display area DA.

The electronic device 1 may provide an image through pixels located in the first display area DA1 and the second display area DA2. The first display area DA1 and the second display area DA2 may display different images, or may display parts of one image.

The second display area DA2 may have any of polygonal shapes such as an octagonal shape in a plan view as shown in FIG. 1A. Alternatively, the second display area DA2 may have a circular shape or an elliptical shape. Alternatively, the second display area DA2 may have a polygonal shape such as a quadrangular shape or a bar shape as shown in FIG. 1B.

The second display area DA2 may be located inside the first display area DA1 (FIG. 1A), or may be located on a side of the first display area DA1 (FIG. 1B). As shown in FIG. 1A, the second display area DA2 may be surrounded by the first display area DA1. In some example embodiments, the second display area DA2 may be partially surrounded by the first display area DA1. For example, the second display area DA2 may be located at a corner portion of the first display area DA1, and may be partially surrounded by the first display area DA1.

A ratio of the second display area DA2 to the display area DA may be less than a ratio of the first display area DA1 to the display area DA. The electronic device 1 may include one second display area DA2 as shown in FIG. 1A, or may include two or more second display areas DA2.

Examples of the electronic device 1 may include a mobile phone, a tablet personal computer (PC), a laptop, and a smart watch or a smart band worn on the wrist.

Figure 2:
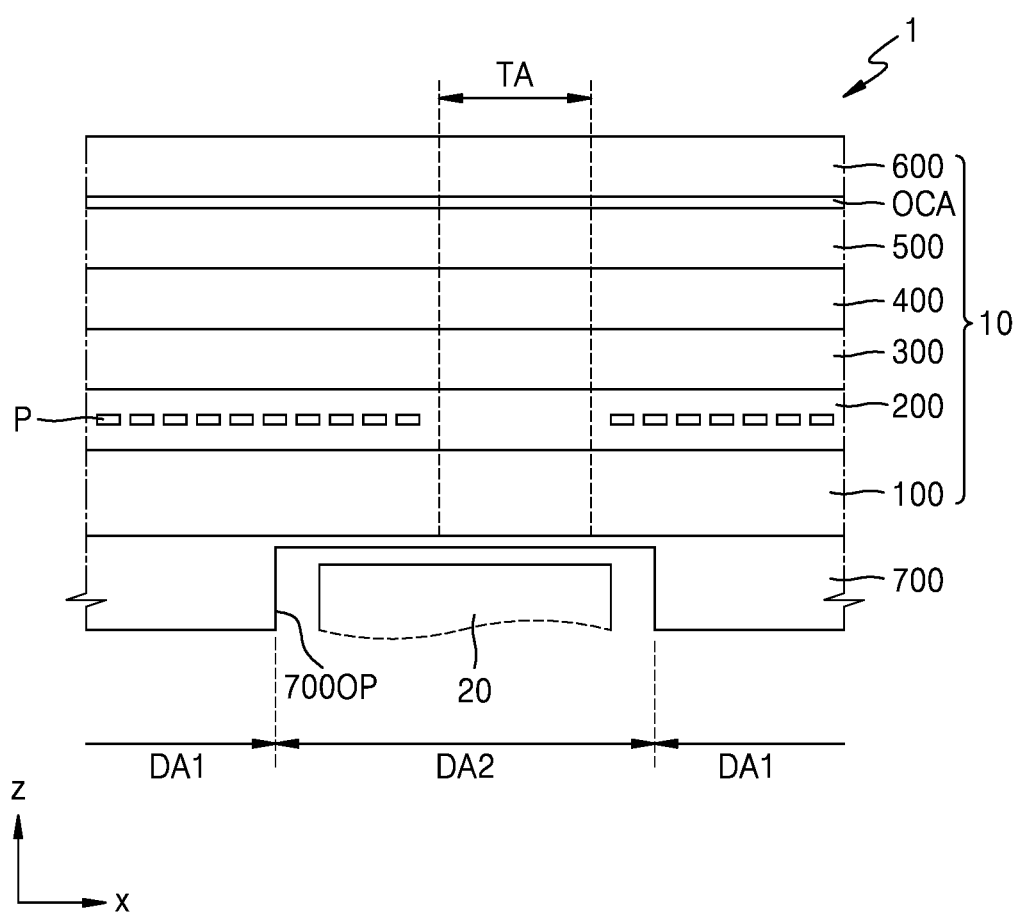
FIG. 2 is a cross-sectional view illustrating an electronic device including a display apparatus according to some example embodiments.

FIG. 2 is a cross-sectional view illustrating an electronic device including a display apparatus according to some example embodiments.

Referring to FIG. 2, the electronic device 1 may include a display apparatus 10 and a component 20 located on a rear surface of the display apparatus 10. According to some example embodiments, the component 20 may include any suitable component according to the design of the electronic device 1. For example, according to some example embodiments, the component 20 may be an electrical component that is configured to transmit or receive signals (e.g., in the form of light, wireless data transmission, sound, etc.) at a transmission area of the second display area DA2 corresponding to the component 20.

The display apparatus 10 may include a substrate 100, a display layer 200 including pixels P located on a front surface of the substrate 100, an encapsulation layer 300 on the pixels P, an input sensing layer 400, an optical functional layer 500, and a window 600. A lower protective film 700 may be located on a rear surface of the substrate 100.

The display layer 200 may include the pixels P. Each pixel may include a display element, and may emit red, green, or blue light. The display element may include a light-emitting diode, e.g., an organic light-emitting diode (OLED). Alternatively, the light-emitting diode may include an inorganic light-emitting diode.

The display element (e.g., an inorganic light-emitting diode) may include a PN junction diode including inorganic semiconductor-based materials. When a voltage is applied in a forward direction to a PN junction diode, holes and electrons are injected, and energy generated due to recombination of the holes and the electrons may be converted into light energy to emit light of a certain color. The inorganic light-emitting diode may have a width ranging from several to hundreds of micrometers, and in some example embodiments, the inorganic light-emitting diode may be referred to as a micro-light-emitting diode (LED). The following embodiments will be described assuming that the light-emitting diode is an organic light-emitting diode for convenience of explanation, but as a person having ordinary skill the in the art would recognize, embodiments according to the present disclosure are not limited thereto, and the display element may include any suitable display element.

The encapsulation layer 300 may cover the pixels P. The encapsulation layer 300 may include an encapsulation substrate including a rigid material such as a glass material, or may include a flexible thin-film encapsulation layer including at least one inorganic encapsulation layer and at least one organic encapsulation layer.

The input sensing layer 400 may obtain coordinate information according to an external input, for example, a touch event of an external object such as a user's finger, a stylus pen, or the like. The input sensing layer 400 may include a touch electrode and trace lines connected to the touch electrode. The input sensing layer 400 may detect the external input by using a mutual capacitance method or a self-capacitance method, although embodiments according to the present disclosure are not limited thereto, and the input sensing layer 400 may include any other suitable input sensing component according to the design of the electronic device 1.

The input sensing layer 400 may be directly formed on the encapsulation layer 300, and in this case, no adhesive layer may be located between the encapsulation layer 300 and the input sensing layer 400. According to some example embodiments, the input sensing layer 400 may be formed in a separate process, and then may be attached to the encapsulation layer 300 through an adhesive layer.

The optical functional layer 500 may be located on the input sensing layer 400. The optical functional layer 500 may improve the efficiency of light emitted from each pixel P, and/or may reduce a reflectance of external light incident on the display apparatus 10. In some example embodiments, the optical functional layer 500 may include an optical plate including a phase retarder and/or a polarizer. In some example embodiments, the optical functional layer 500 may include a filter plate including a color filter and a black matrix. In some example embodiments, the optical functional layer 500 may include a plurality of layers having different refractive indices.

The window 600 may be located on the optical functional layer 500, and an adhesive layer such as an optically clear adhesive (OCA) may be located between the window 600 and the optical functional layer 500.

The component 20 may be located in the second display area DA2. The component 20 may be an electronic element using light and/or sound. For example, the electronic element may be a sensor that measures a distance such as a proximity sensor, a sensor that recognizes a user's body part (e.g., fingerprint, iris, or face), a small lamp that outputs light, or an image sensor (e.g., a camera) that captures an image. The electronic element using light may use light of any of various wavelength bands such as visible light, infrared light, or ultraviolet light. The electronic element using sound may use ultrasound or sound of another frequency band. In some example embodiments, the component 20 may include sub-components such as a light emitter and a light receiver. The light emitter and the light receiver may be integrated or may be physically separated, to constitute one component 20.

Figure 3A:
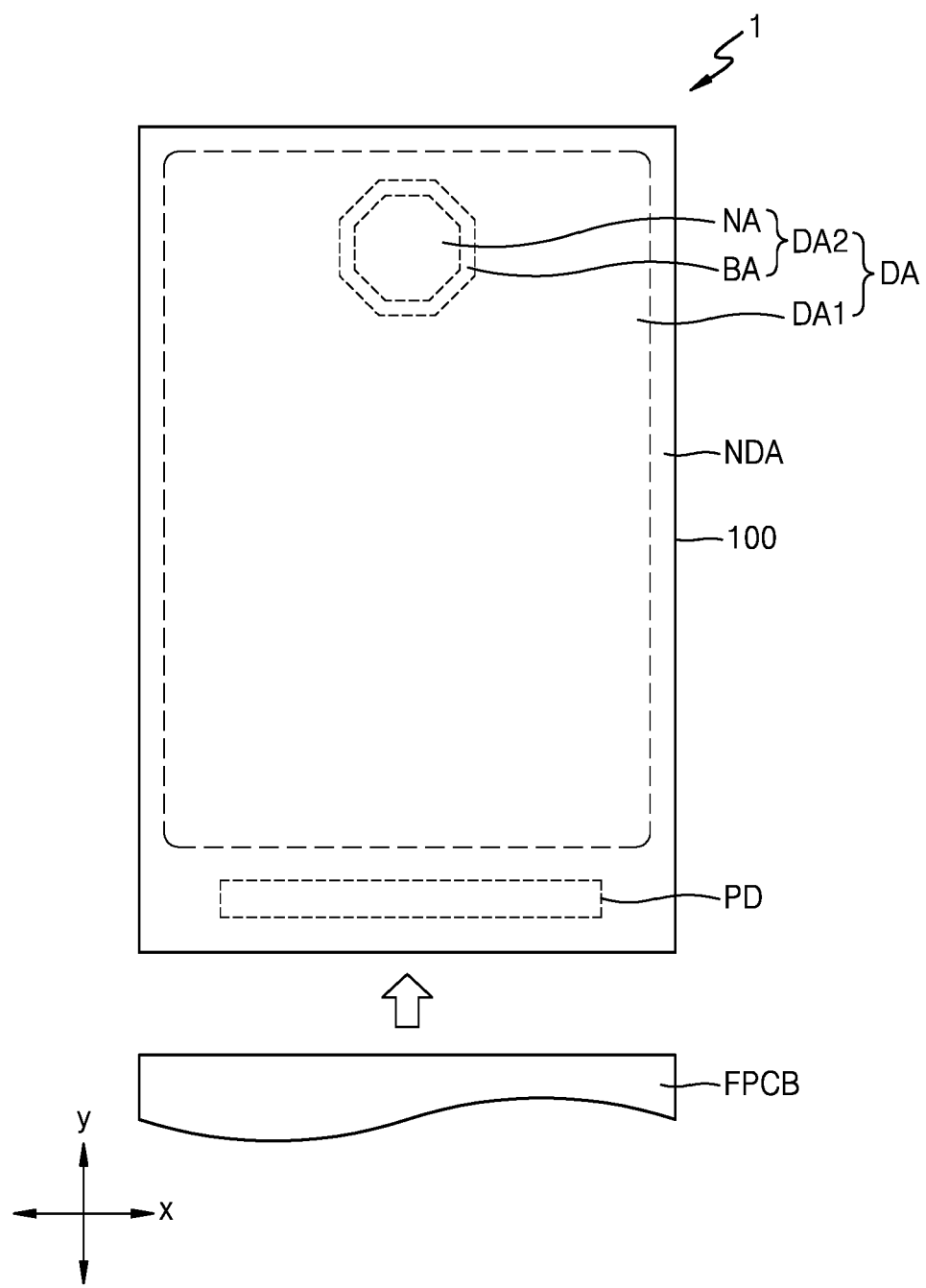
FIGS. 3A and 3B are plan views each illustrating a display apparatus according to some example embodiments.
Figure 3B:
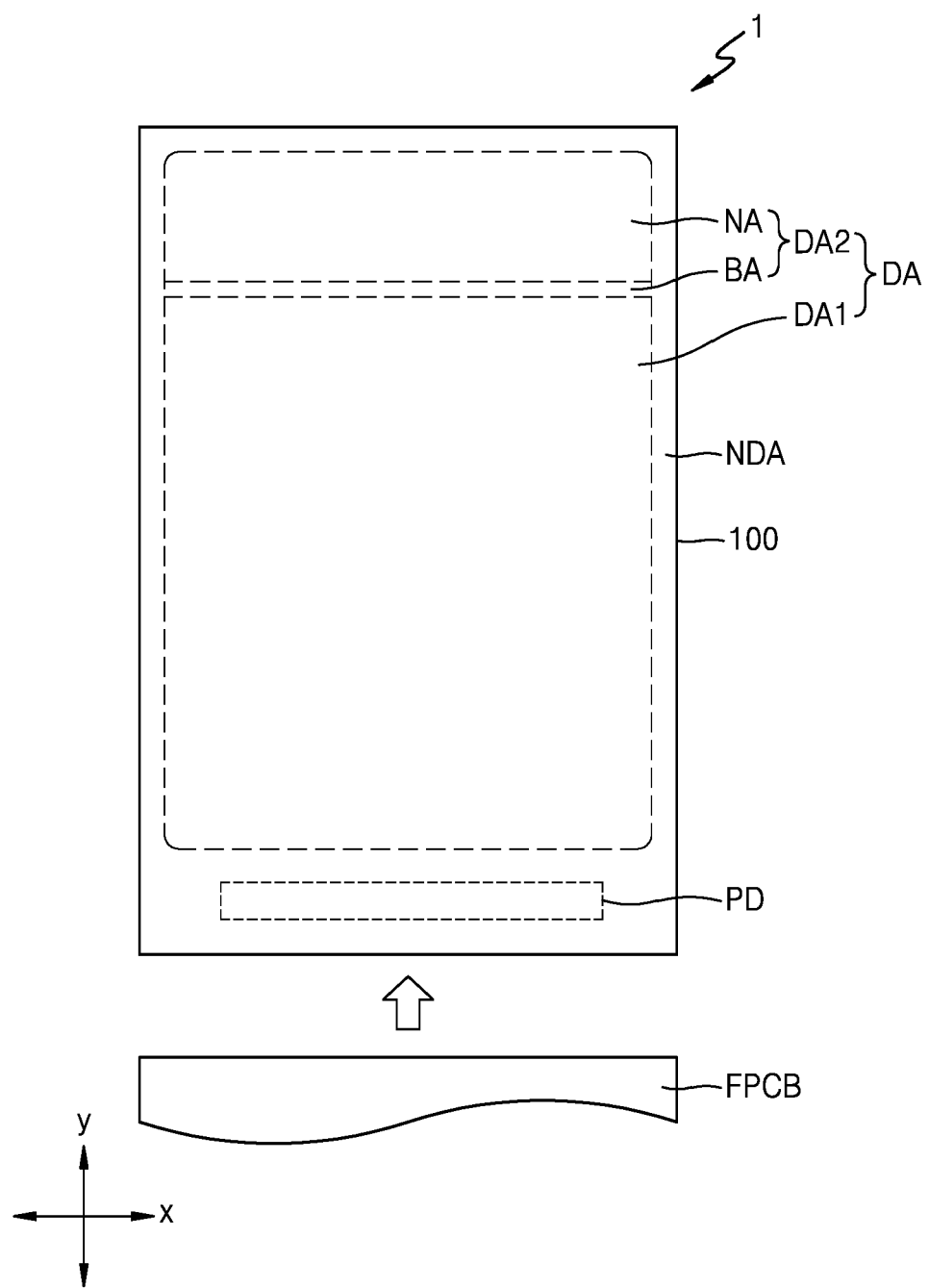

FIGS. 3A and 3B are plan views each illustrating a display apparatus according to some example embodiments.

Referring to FIGS. 3A and 3B, the display apparatus 10 may include an array of pixels located on the substrate 100. The array of pixels may be located in the display area DA, and may include pixels that emit red light, green light, and blue light. The display area DA may include the first display area DA1 and the second display area DA2, and the second display area DA2 may include the normal display area NA and the buffer display area BA.

The second display area DA2 may have a polygonal shape such as an octagonal shape or a quadrangular shape in a plan view, or a circular shape or an elliptical shape. The second display area DA2 may be entirely surrounded by the first display area DA1 in a plan view as shown in FIG. 3A. Alternatively, the second display area DA2 may be partially surrounded by the first display area DA1 as shown in FIG. 3B. The buffer display area BA of the second display area DA2 may be located between the normal display area NA and the first display area DA1, and may entirely surround the normal display area NA as shown in FIG. 3A or may be located on a side of the normal display area NA as shown in FIG. 3B.

The non-display area NDA may entirely surround the display area DA. A scan driver, a data driver, etc. may be located in the non-display area NDA. A pad PD may be located in the non-display area NDA. The pad PD may be located adjacent to one of edges of the substrate 100. The pad PD may be exposed without being covered by an insulating layer, and may be electrically connected to a flexible printed circuit board FPCB. The flexible printed circuit board FPCB may electrically connect a controller and the pad PD, and may apply a signal or power transmitted from the controller. In some example embodiments, a data driver may be located on the flexible printed circuit board FPCB. In order to transmit a signal or a voltage from the flexible printed circuit board FPCB to the pixels, the pad PD may be connected to a plurality of wirings.

According to some example embodiments, an integrated circuit, instead of the flexible printed circuit board FPCB, may be located on the pad PD. The integrated circuit may include, for example, a data driver, and may be electrically connected to the pad PD through an anisotropic conductive film including a conductive ball.

Each pixel of the first display area DA1 and the second display area DA2 may include a light-emitting diode, and the light-emitting diode may be electrically connected to a pixel circuit including a transistor and a capacitor.

Figure 4:
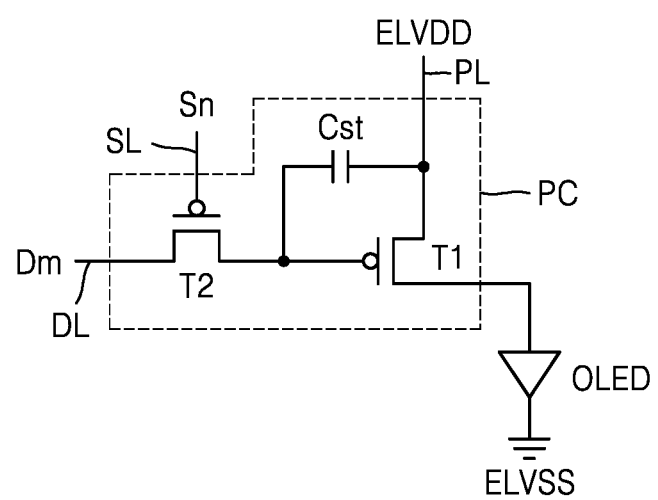
FIG. 4 is an equivalent circuit diagram illustrating a pixel circuit connected to a light-emitting diode of a display apparatus according to some example embodiments.

FIG. 4 is an equivalent circuit diagram illustrating a pixel circuit connected to a light-emitting diode of a display apparatus according to some example embodiments.

Referring to FIG. 4, a light-emitting diode may include an organic light-emitting diode OLED. The organic light-emitting diode OLED is electrically connected to a pixel circuit PC. The pixel circuit PC may include a first thin-film transistor T1, a second thin-film transistor T2, and a storage capacitor Cst.

The second thin-film transistor T2 that is a switching thin-film transistor may be connected to a scan line SL and a data line DL, and may transmit a data voltage (or a data signal Dm) input from the data line DL to the first thin-film transistor T1 based on a switching voltage (or a switching signal Sn) input from the scan line SL. The storage capacitor Cst may be connected to the second thin-film transistor T2 and a driving voltage line PL, and may store a voltage corresponding to a difference between a voltage received from the second thin-film transistor T2 and a first power supply voltage ELVDD supplied to the driving voltage line PL.

The first thin-film transistor T1 that is a driving thin-film transistor may be connected to the driving voltage line PL and the storage capacitor Cst, and may control driving current flowing from the driving voltage line PL to the organic light-emitting diode OLED in response the voltage stored in the storage capacitor Cst. The organic light-emitting diode OLED may emit light having a certain brightness according to the driving current. A counter electrode (e.g., a cathode) of the organic light-emitting diode OLED may receive a second power supply voltage ELVSS.

Although the pixel circuit PC includes two thin-film transistors and one storage capacitor in FIG. 4, the number of thin-film transistors and the number of storage capacitors may be changed in various ways according to a design of the pixel circuit PC. For example, the pixel circuit PC may include, three, four, five, or more thin-film transistors, and two or more capacitors.

Figure 5:
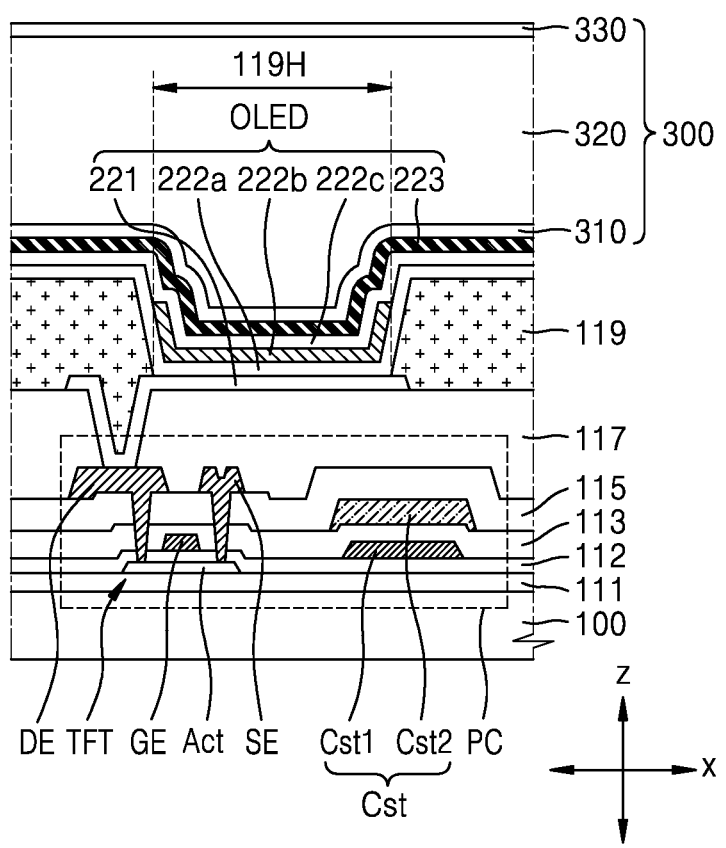
FIG. 5 is a cross-sectional view illustrating a light-emitting diode of one pixel of a display apparatus and a pixel circuit electrically connected to the light-emitting diode, according to some example embodiments.

FIG. 5 is a cross-sectional view illustrating a light-emitting diode and a pixel circuit of a display apparatus according to some example embodiments.

Referring to FIG. 5, the pixel circuit PC may be formed on the substrate 100, and a light-emitting diode, e.g., the organic light-emitting diode OLED, may be formed on the pixel circuit PC.

The substrate 100 may include glass or a polymer resin. The polymer resin may include any suitable substrate material including, for example, polyethersulfone, polyacrylate, polyetherimide, polyethylene naphthalate, polyethylene terephthalate, polyphenylene sulfide, polyarylate, polyimide, polycarbonate, and/or cellulose acetate propionate.

A buffer layer 111 may be located on the substrate 100. The buffer layer 111 may reduce or prevent penetration of a foreign material, moisture, contaminants, or external air from the bottom of the substrate 100 and may planarize the substrate 100. The buffer layer 111 may include an inorganic insulating material such as silicon oxide, silicon oxynitride, or silicon, and may have a single or multi-layer structure including the above material.

The pixel circuit PC including a thin-film transistor TFT and the storage capacitor Cst may be located on the buffer layer 111. The thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act. A gate insulating layer 112 may be located between the semiconductor layer Act and the gate electrode GE, and a first interlayer insulating layer 113 and a second interlayer insulating layer 115 may be located between the gate electrode GE and the source electrode SE or between the gate electrode GE and the drain electrode DE.

The semiconductor layer Act may include polysilicon. In some example embodiments, the semiconductor layer Act may include amorphous silicon. In some example embodiments, the semiconductor layer Act include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), or zinc (Zn).

The gate insulating layer 112 may include an inorganic insulating material such as silicon oxide, silicon oxynitride, or silicon nitride, and may have a single or multi-layer structure including the above material. The source electrode SE or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material. For example, the source electrode SE or the drain electrode DE may have a three-layer structure including a titanium layer, an aluminum layer, and a titanium layer.

The storage capacitor Cst may include a first capacitor plate Cst1 and a second capacitor plate Cst2 overlapping each other. The first interlayer insulating layer 113 may be located between the first capacitor plate Cst1 and the second capacitor plate Cst2. The first capacitor plate Cst1 and the gate electrode GE may include the same material. Although the first capacitor plate Cst1 and the gate electrode GE are spaced apart from each other in an x-direction in FIG. 5, according to some example embodiments, the first capacitor plate Cst1 may include the gate electrode GE. For example, the first capacitor plate Cst1 may include the gate electrode GE, or a part of the gate electrode GE may include the first capacitor plate Cst1. In some example embodiments, the gate electrode GE may have a function of the first capacitor plate Cst1.

The gate electrode GE and/or the first capacitor plate Cst1 may include a low-resistance conductive material such as molybdenum (Mo), aluminum (Al), copper (Cu), and/or titanium (Ti), and may have a single or multi-layer structure including the above material.

The first interlayer insulating layer 113 may include an inorganic insulating material such as silicon oxide, silicon oxynitride, or silicon nitride, and may have a single or multi-layer structure including the above material.

The second capacitor plate Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The second interlayer insulating layer 115 may include an inorganic insulating material such as silicon oxide, silicon oxynitride, or silicon nitride, and may have a single or multi-layer structure including the above material.

A planarization layer 117 may include a material different from that of at least one inorganic insulating layer, for example, the gate insulating layer 112, the first interlayer insulating layer 113, and/or the second interlayer insulating layer 115, located under the planarization layer 117. The planarization layer 117 may include an organic insulating material such as acryl, benzocyclobutene (BCB), polyimide, or hexamethyldisiloxane (HMDSO).

A pixel electrode 221 may be located on the planarization layer 117. The pixel electrode 221 may be electrically connected to the thin-film transistor TFT through a contact hole formed in the planarization layer 117.

The pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrode 221 may include a reflective film including the above material, and a transparent conductive film located over and/or under the reflective film. The transparent conductive layer may include indium tin oxide (ITO), indium zinc oxide (IZO), zinc oxide (ZnO), indium oxide ($In_2O_3$), indium gallium oxide (IGO), and/or aluminum zinc oxide (AZO). According to some example embodiments, the pixel electrode 221 may have a three-layer structure including an ITO layer, an Ag layer, and an ITO layer that are sequentially stacked.

An upper insulating layer 119 may cover an edge of the pixel electrode 221, and may have a through-hole through which a central portion of the pixel electrode 221 is exposed. In this regard, FIG. 5 illustrates a through-hole 119H1 of the upper insulating layer 119. The through-hole 119H1 of the upper insulating layer 119 may define an emission area of the organic light-emitting diode OLED, and the emission area emitting light (e.g., red light, blue light, or green light) may correspond to a pixel. The upper insulating layer 119 may include an organic insulating material such as benzocyclobutene (BCB), polyimide, or hexamethyldisiloxane (HMDSO).

An emission layer 222b may overlap the pixel electrode 221 through the through-hole 119H1 of the upper insulating layer 119. The emission layer 222b may include an organic material. The emission layer 222b may include a high molecular weight organic material or a low molecular weight organic material emitting light of a certain color. The emission layer 222b may be formed by using a deposition process using a mask as described above.

A first functional layer 222a and a second functional layer 222c may be respectively located under and over the emission layer 222b.

The first functional layer 222a may have a single or multi-layer structure. For example, when the first functional layer 222a is formed of a high molecular weight material, the first functional layer 222a may include a hole transport layer (HTL) having a single-layer structure and may be formed of poly-(3,4)-ethylene-dioxy thiophene (PEDOT) or polyaniline (PANI). When the first functional layer 222a is formed of a low molecular weight material, the first functional layer 222a may include a hole injection layer (HIL) and a hole transport layer (HTL).

The second functional layer 222c may include an electron transport layer (ETL) and/or an electron injection layer (EIL).

A counter electrode 223 may be formed of a conductive material having a relatively low work function. For example, the counter electrode 223 may include a (semi-)transparent layer including silver (Ag), magnesium (Mg), aluminum (Al), nickel (Ni), chromium (Cr), lithium (Li), calcium (Ca), or an alloy thereof. Alternatively, the counter electrode 223 may further include a layer formed of ITO, IZO, ZnO, or $In_2O_3$ on the (semi-)transparent layer including the above material. According to some example embodiments, the counter electrode 223 may include silver (Ag) and magnesium (Mg). The counter electrode 223 may be integrally formed to entirely cover the first and second display areas DA1 and DA2 (see FIG. 3A, etc.).

The encapsulation layer 300 may be located on the organic light-emitting diode OLED including the pixel electrode 221, the emission layer 222b, and the counter electrode 223. The encapsulation layer 300 may include a flexible encapsulation layer including an inorganic insulating layer and an organic insulating layer, or may include a substrate including a rigid material such as encapsulation glass. According to some example embodiments, the encapsulation layer 300 may be a flexible encapsulation layer having a stacked structure including a first inorganic encapsulation layer 310, an organic encapsulation layer 320, and a second inorganic encapsulation layer 330.

Figure 6:
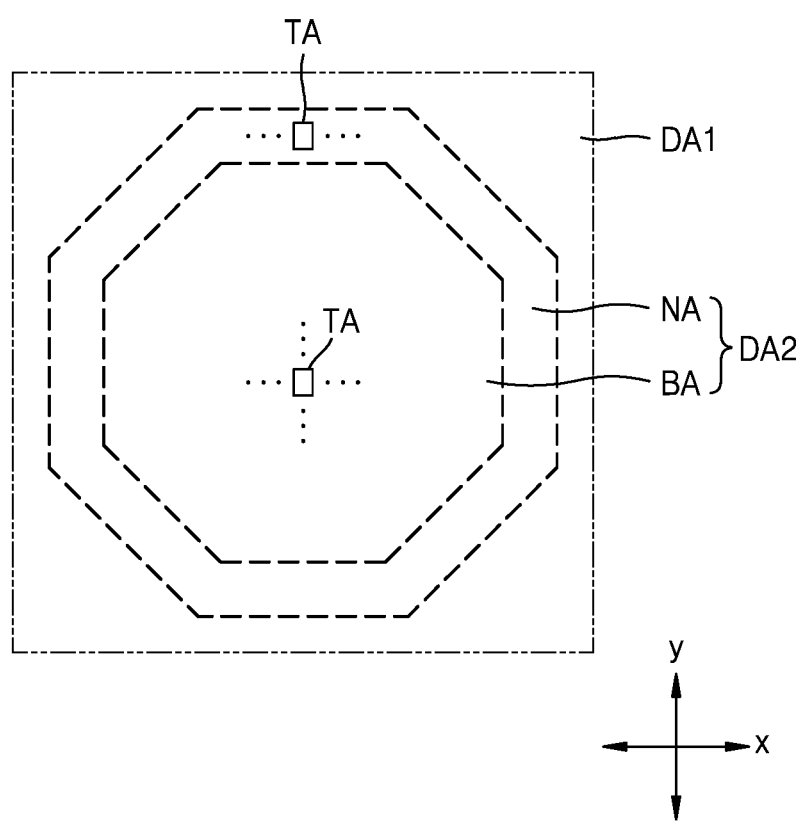
FIG. 6 is an enlarged plan view illustrating part of a display area of a display apparatus according to some example embodiments.

FIG. 6 is an enlarged plan view illustrating a part of a display area of a display apparatus according to some example embodiments.

Referring to FIG. 6, the first display area DA1 and the second display area DA2 may include a plurality of pixels. Because the component 20 is located in the second display area DA2 of the display apparatus 10 as described with reference to FIG. 2, the second display area DA2 includes a transmission area TA through which light and/or sound travelling toward the component 20 and/or emitted from the component 20 may be transmitted.

Because the second display area DA2 includes the transmission area TA, a pixel density of the second display area DA2 may be different from a pixel density of the first display area DA1. For example, in the same area, an aperture ratio and/or the number of pixels of the second display area DA2 may be less than an aperture ratio and/or the number of pixels of the first display area DA1. In this case, there is a problem that a boundary between display areas may be recognized by a user unintentionally (or unnecessarily). However, according to some example embodiments, the problem may be solved, by causing the second display area DA2 to include the normal display area NA and the buffer display area BA having different pixel densities and/or different transmission area densities.

In some example embodiments, the visibility of a boundary between the first display area DA1 and the second display area DA2 may be prevented or reduced, by causing the buffer display area BA to have a pixel density and/or a transmission area density (a ratio of an area occupied by the transmission area TA in a unit area) different from that of the normal display area NA.

In some example embodiments, a boundary between the first display area DA1 and the second display area DA2 may be prevented from being recognized, by adjusting an arrangement of pixels of the buffer display area BA and/or a width of the transmission area TA.

Figure 7:
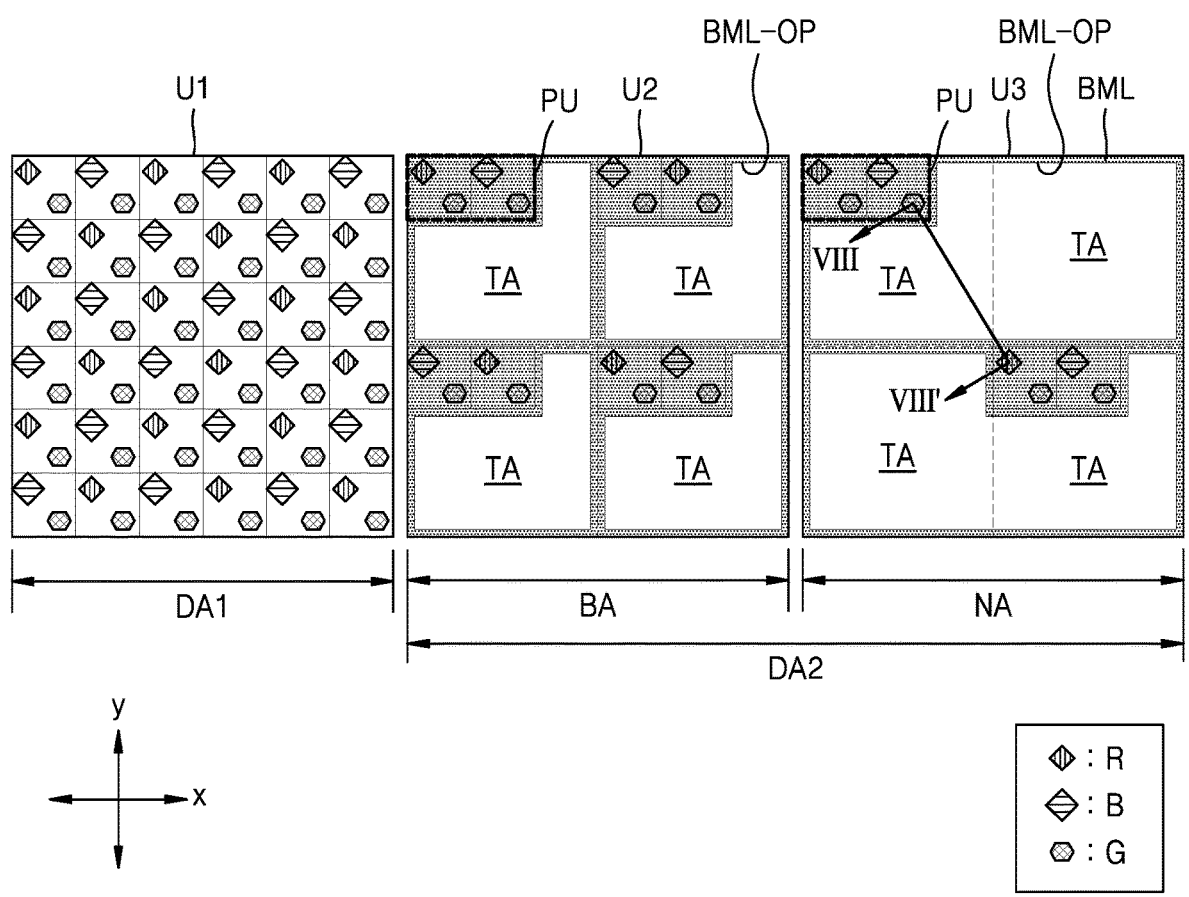
FIG. 7 is a plan view illustrating a first display area and a second display area of a display apparatus according to some example embodiments.
Figure 8:
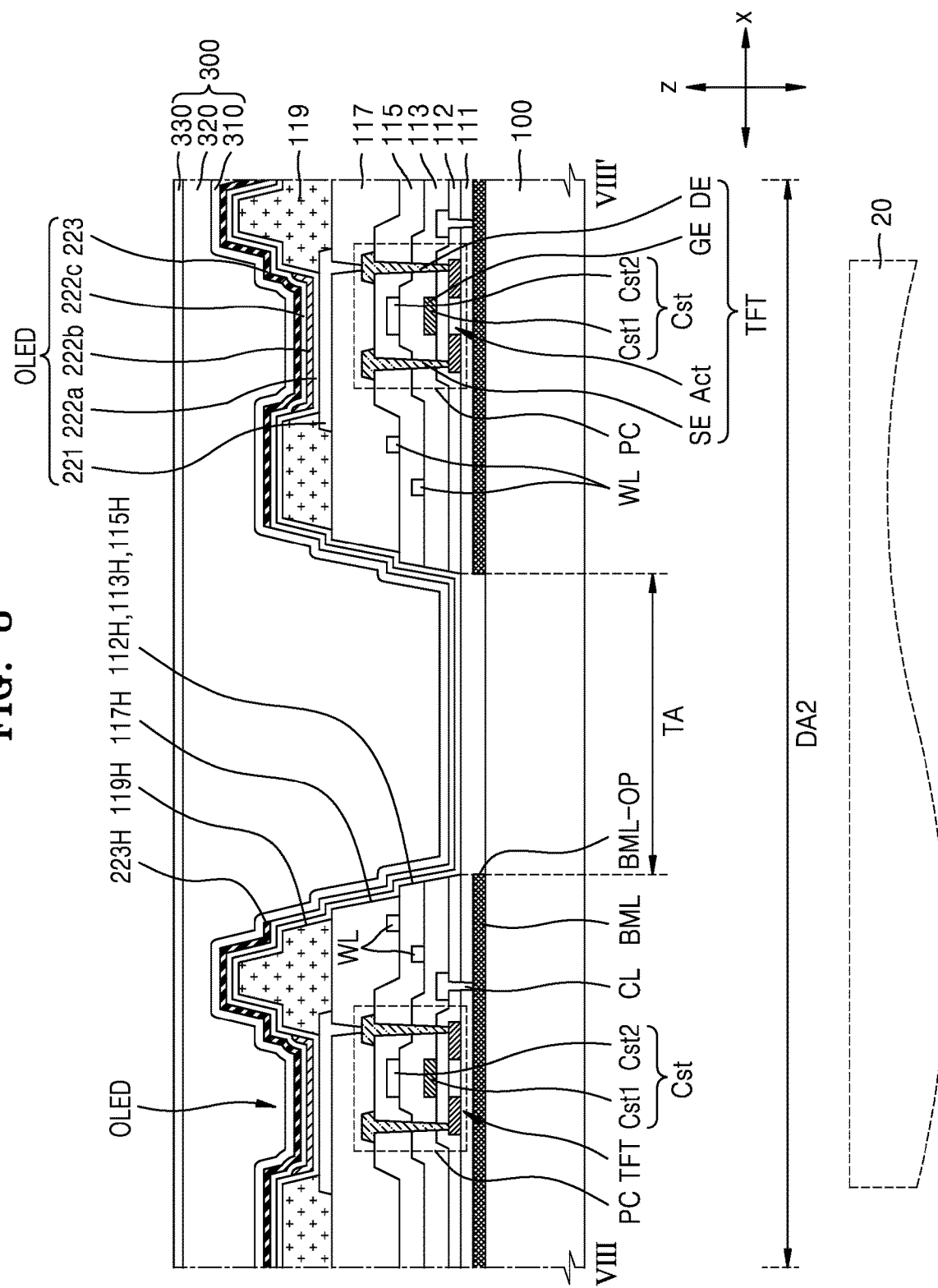
FIG. 8 is a cross-sectional view taken along the line VIII-VIII' of FIG. 7.

FIG. 7 is a plan view illustrating a first display area and a second display area of a display apparatus according to some example embodiments. FIG. 8 is a cross-sectional view taken along the line VIII-VIII' of FIG. 7.

Referring to FIG. 7, the first display area DA1 may include red pixels R, green pixels G, and blue pixels B. The red pixels R, the green pixels G, and the blue pixels B may be arranged in a diamond PenTile™ type. When the red pixels R, the green pixels G, and the blue pixels B are arranged in a diamond PenTile™ type, the number of green pixels G may be about twice the number of red pixels R and the number of blue pixels B. The red pixels R may be arranged in a first diagonal direction oblique to the x-direction and a y-direction, and each green pixel G may be located between adjacent red pixels R in the first diagonal direction. The blue pixels B may be arranged in a second diagonal direction intersecting the first diagonal direction and oblique to the x-direction and the y-direction, and each green pixel G may be located between adjacent blue pixels B in the second diagonal direction. One red pixel R and one blue pixel B in the x-direction and two green pixels G in the y-direction may be respectively located at vertexes of a virtual diamond.

Pixels of the second display area DA2 may have an arrangement that is the same as that of pixels of the first display area DA1 (e.g., a diamond PenTile™ type) as shown in FIG. 7. In some example embodiments, pixels of the second display area DA2 may have an arrangement that is different from that of pixels of the first display area DA1.

The second display area DA2 may include the transmission area TA. For example, the transmission area TA may be located between adjacent pixel groups PU. The transmission area TA is an area where pixels are not located and through which light and/or sound may be transmitted. The transmission area TA may provide a passage through which light and/or sound travelling toward the component 20 or emitted from the component 20 may be transmitted as described with reference to FIG. 2.

Because the second display area DA2 includes the transmission area TA, a pixel density of the first display area DA1 may be different from a pixel density of the second display area DA2. For example, an aperture ratio and/or the number of pixels of a first unit U1 in the first display area DA1 may be greater than an aperture ratio and/or the number of pixels of a second unit U2 in the buffer display area BA, and the aperture ratio and/or the number of pixels of the second unit U2 in the buffer display area BA may be greater than an aperture and/or the number of pixels of a third unit U3 in the normal display area NA, thereby preventing a boundary between the first display area DA1 and the second display area DA2 from being recognized. The areas of the first unit U1, the second unit U2, and the third unit U3 are the same.

The second display area DA2 may include a blocking metal layer BML. Referring to FIG. 8, the blocking metal layer BML may be located between the substrate 100 and the pixel circuits PC.

Referring to FIG. 8, pixels located in the second display area DA2 may include the organic light-emitting diode OLED located on the substrate 100, and the organic light-emitting diode OLED is electrically connected to the pixel circuit PC located under the organic light-emitting diode OLED. The pixel circuit PC may include the thin-film transistor TFT and the storage capacitor Cst. The thin-film transistor TFT may include the semiconductor layer Act, the gate electrode GE, the source electrode SE, and the drain electrode DE, and the storage capacitor Cst may include the first capacitor plate Cst1 and the second capacitor plate Cst2, as described above with reference to FIG. 5. In some example embodiments, the gate electrode GE of the storage thin-film transistor TFT may include the first capacitor plate Cst1 of the capacitor Cst as shown in FIG. 8.

The blocking metal layer BML may overlap the pixel circuits PC and/or wirings WL located in the second display area DA2. The blocking metal layer BML may prevent light emitted from the component 20 or travelling toward the component 20 from being diffracted through a gap between the pixel circuits PC and/or the wirings WL.

The blocking metal layer BML may have a certain voltage, and in this case, the blocking metal layer BML may improve the operating characteristics of the pixel circuit PC. In some example embodiments, the blocking metal layer BML may be electrically connected to the gate electrode GE, the source electrode SE, or the drain electrode DE of the thin-film transistor TFT. The blocking metal layer BML may be electrically connected to the driving voltage line PL described with reference to FIG. 4.

The blocking metal layer BML may have an opening BML-OP corresponding to the transmission area TA. In order to increase a transmittance of the transmission area TA, insulating layers on the substrate 100, e.g., the gate insulating layer 112, the first interlayer insulating layer 113, the second interlayer insulating layer 115, the planarization insulating layer 117, and/or the upper insulating layer 119, may have holes 112H, 113H, 115H, 117H, and/or 119H overlapping the transmission area TA. The first functional layer 222a and the second functional layer 222c may cover the transmission area TA, whereas the counter electrode 223 may have a hole 223H overlapping the transmission area TA.

In the second display area DA2, the blocking metal layer BML may include a metal material portion overlapping pixels and the opening BML-OP located in the transmission area TA as shown in FIGS. 7 and 8. The transmission area TA may be defined by the opening BML-OP of the blocking metal layer BML, and the transmission area TA may correspond to the opening BML-OP of the blocking metal layer BML. For example, in a plan view of the display apparatus of FIG. 7, a shape of the transmission area TA may be substantially the same as a shape of the opening BML-OP of the blocking metal layer BML, and a width of the transmission area TA may be substantially the same as a width of the opening BML-OP of the blocking metal layer BML.

The transmission area TA may be located in each of the buffer display area BA and the normal display area NA of the second display area DA2 as shown in FIG. 7. A transmission area density of the buffer display area BA may be less than a transmission area density of the normal display area NA. For example, the area of the transmission area TA of the second unit U2 in the buffer display area BA may be less than the area of the transmission area TA of the third unit U3 in the normal display area NA.

A transmission area density in the second display area DA2, that is, an area occupied by the transmission area TA in a unit area, may decrease in a direction from the normal display area NA to the buffer display area BA. In contrast, an aperture ratio and/or the number of pixels in the second display area DA2 may increase in a direction from the normal display area NA to the buffer display area BA.

Figure 9:
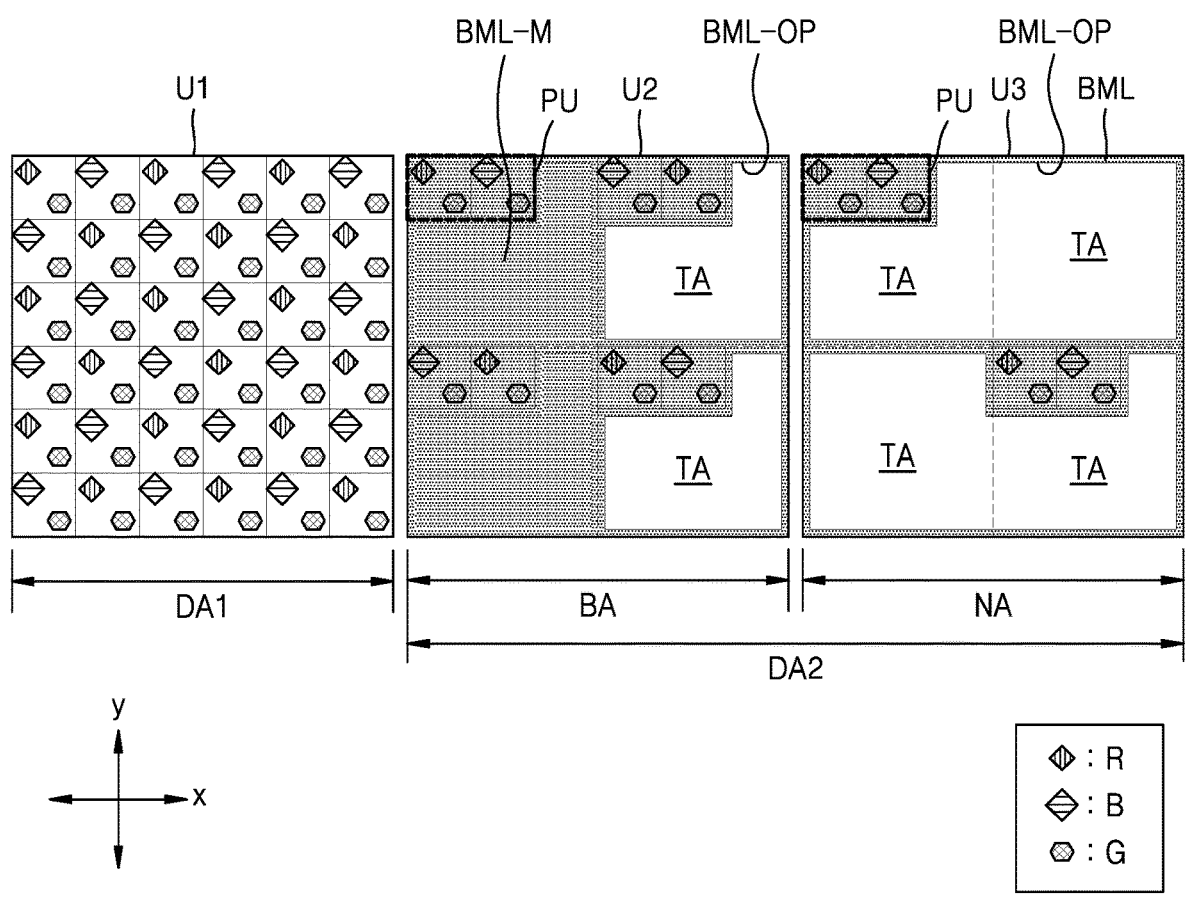
FIG. 9 is a plan view illustrating a display area and a second display area of a display apparatus according to some example embodiments.

Although the transmission area TA is located between adjacent pixel groups PU in the second display area DA2 in FIG. 7, according to some example embodiments, the transmission area TA may not be located between adjacent pixel groups PU as shown in FIG. 9.

FIG. 9 is a plan view illustrating a first display area and a second display area of a display apparatus according to some example embodiments. Referring to FIG. 9, the blocking metal layer BML may be located in the second display area DA2, and the opening BML-OP of the blocking metal layer BML may be located in the normal display area NA and a part of the buffer display area BA. For example, a space (region) between the pixel groups PU that are arranged in the buffer display area BA and are adjacent in the y-direction may be covered by or may overlap a metal material portion BML-M of the blocking metal layer BML. Features other than the above features are the same as those described with reference to FIGS. 7 and 8.

Although pixels of the first display area DA1 and the second display area DA2, for example, the red pixels R, the green pixels G, and the blue pixels B, are arranged under the same rule in FIGS. 7 through 9, according to some example embodiments, arrangements of pixels of display areas may be different from one another as described below with reference to FIGS. 10A and 10B.

Figure 10A:
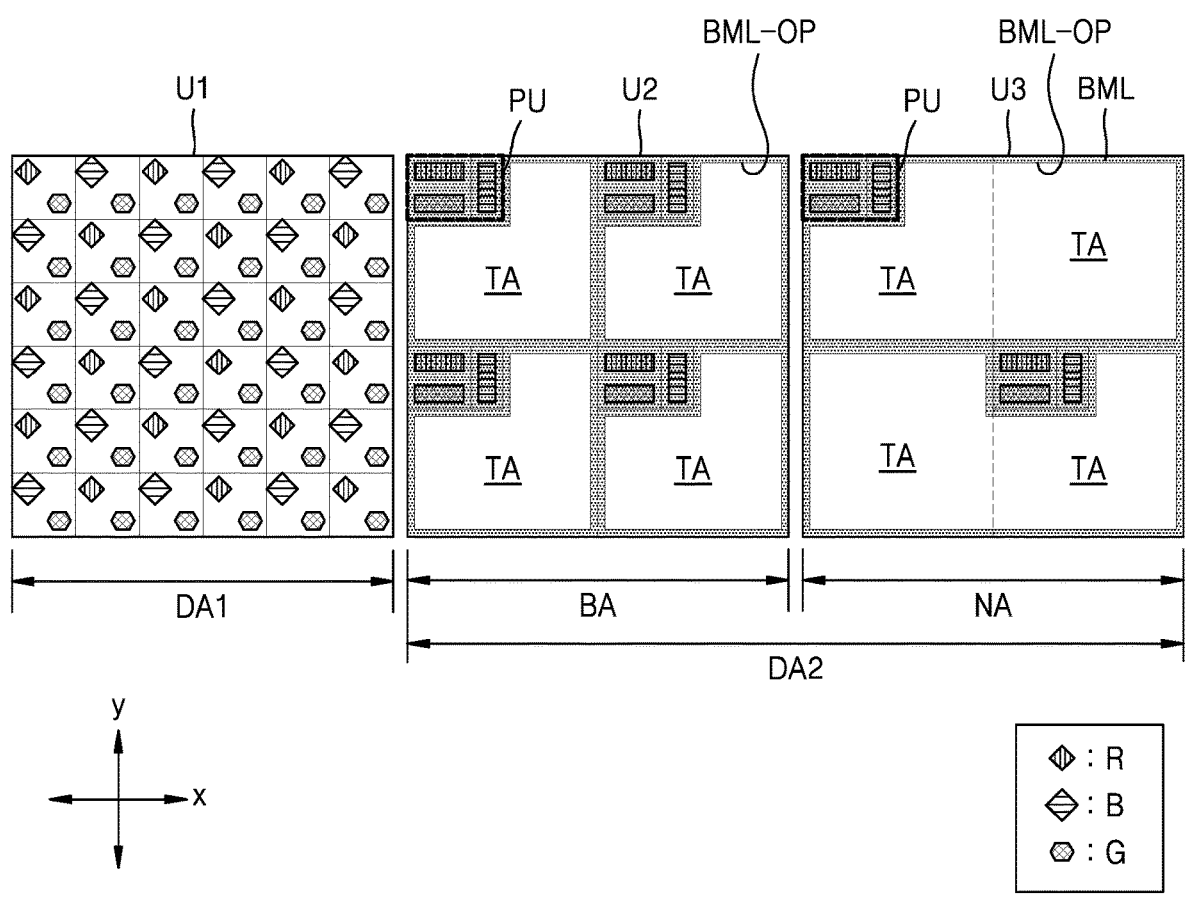
FIGS. 10A and 10B are plan views each illustrating a first display area and a second display area of a display apparatus according to some example embodiments.
Figure 10B:
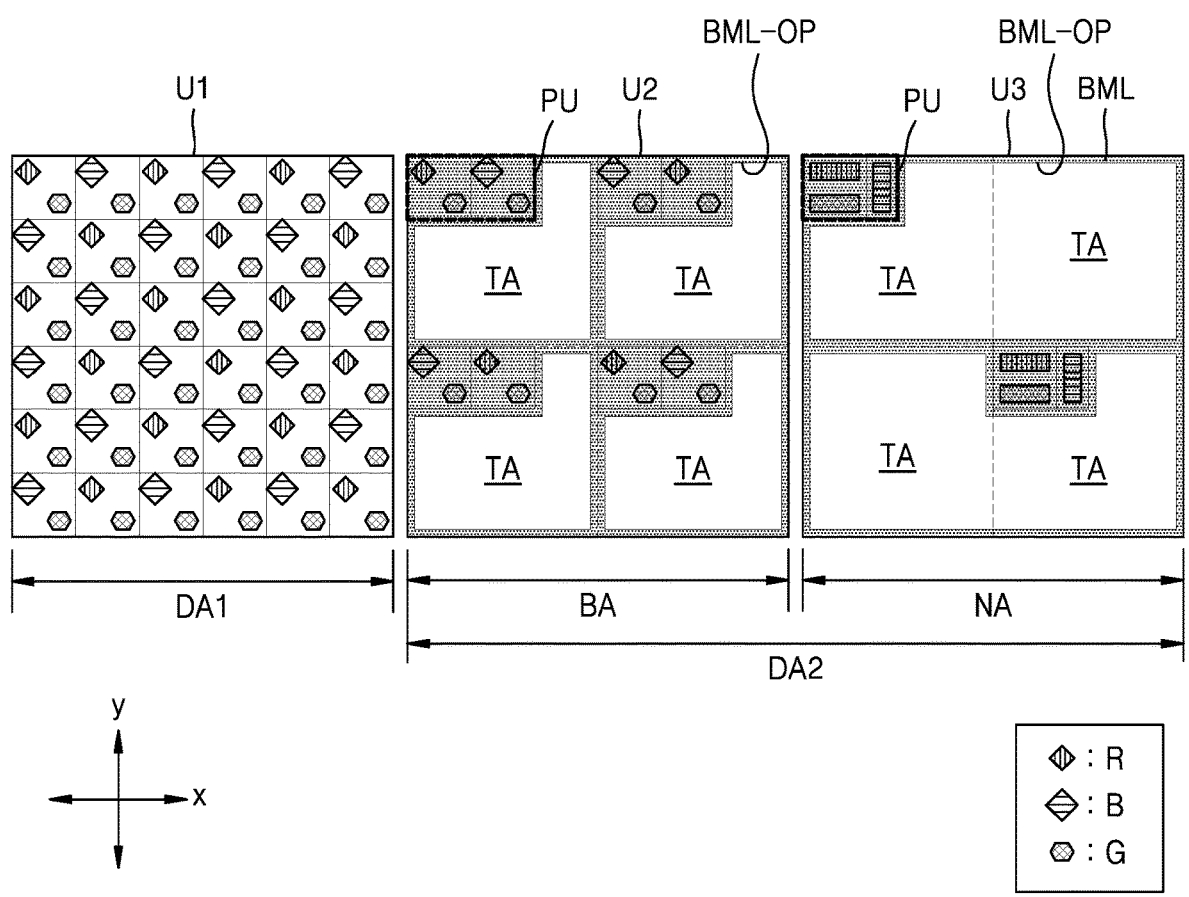

FIGS. 10A and 10B are plan views each illustrating a first display area and a second display area of a display apparatus according to some example embodiments.

Referring to FIG. 10A, pixels of the first display area DA1 may be arranged in a diamond PenTile™ type, whereas pixels of the second display area DA2 may be arranged in an S-PenTile™ type. Referring to pixels of the second display area DA2, the red pixels R and the green pixels G may be alternately arranged in the same column direction (y-direction), and the blue pixels B may be arranged in a column adjacent to a column of the red and green pixels R and G.

Although the opening BML-OP of the blocking metal layer BML is located in each of the buffer display area BA and the normal display area NA in FIG. 10A, according to some example embodiments, the opening BML-OP of the blocking metal layer BML may be located only in the normal display area NA.

Although arrangement structures of pixels located in the second display area DA2 are the same, for example, an arrangement structure of pixels located in the normal display area NA and an arrangement structure of pixels located in the buffer display area BA are the same, in FIG. 10A, the present disclosure is not limited thereto. For example, as shown in FIG. 10B, an arrangement structure of pixels located in the normal display area NA and an arrangement structure of pixels located in the buffer display area BA may be different from each other.

According to embodiments of FIGS. 7, 9, 10A, and 10B, the second display area DA2 includes the buffer display area BA and the normal display area NA having different pixel densities and/or different transmission area densities. According to some example embodiments, the visibility of a boundary between the first and second display areas DA1 and DA2 may be prevented or reduced by turning on/off pixels.

Figure 11A:
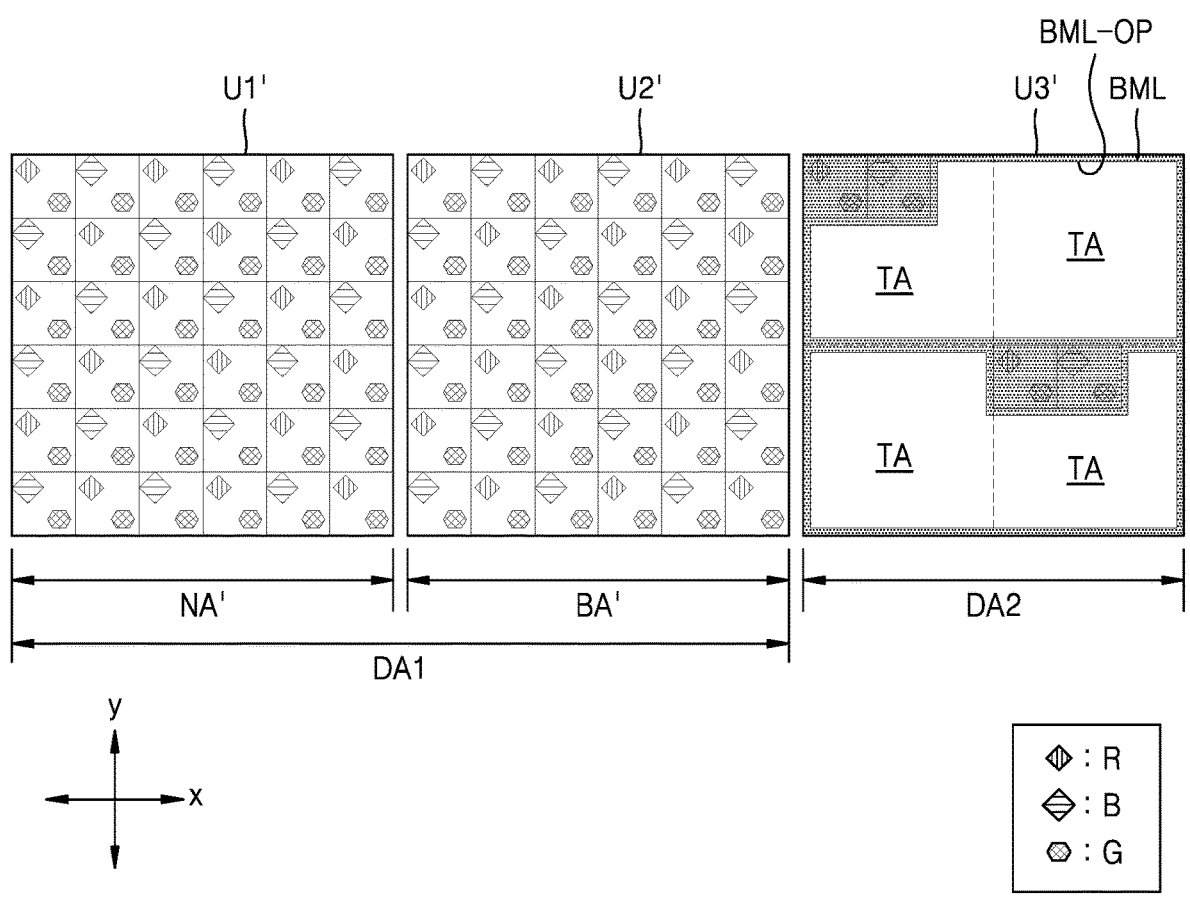
FIG. 11A is a plan view illustrating an off-state of pixels located in a first display area and a second display area of a display apparatus according to some example embodiments.
Figure 11B:
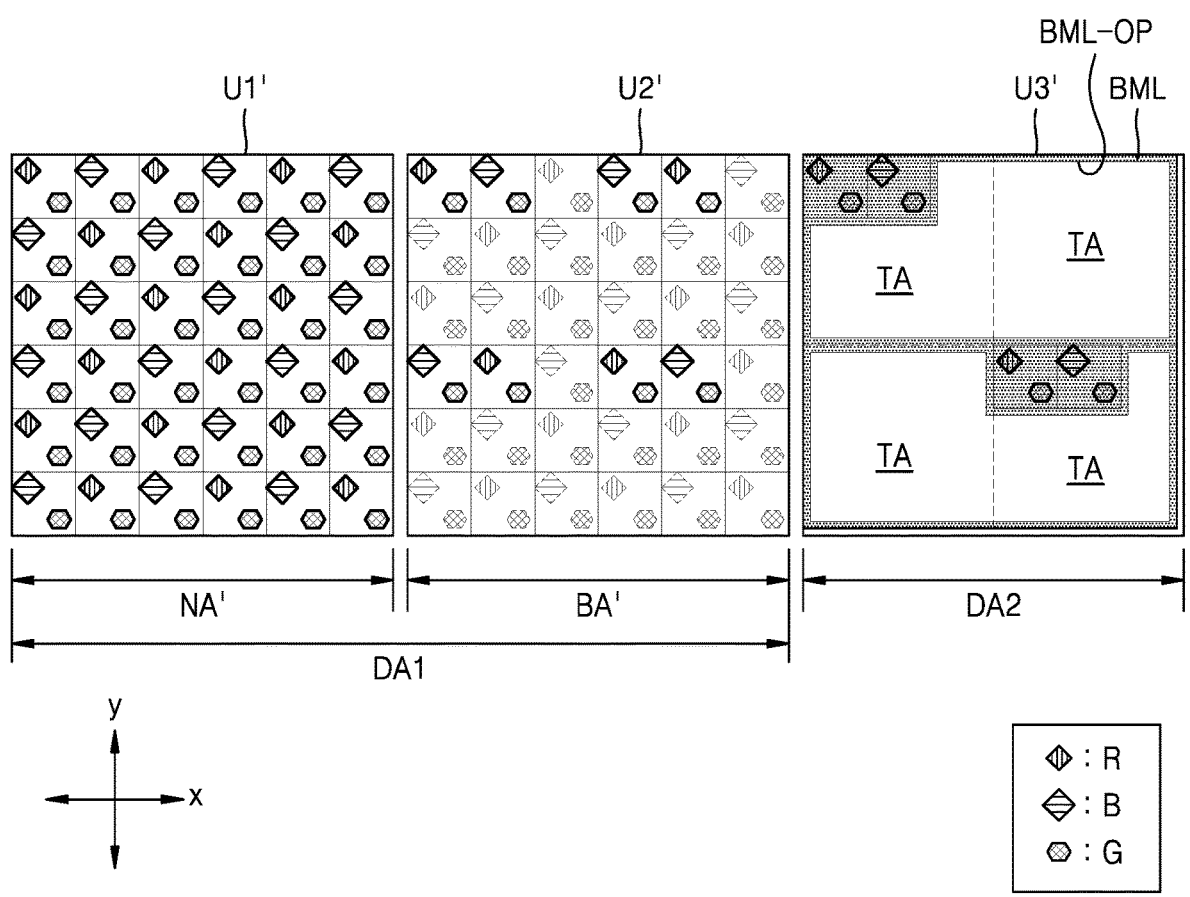
FIG. 11B illustrates an on-state of the pixels of a display apparatus according to some example embodiments.

FIG. 11A is a plan view illustrating an off-state of pixels located in a first display area and a second display area of a display apparatus according to some example embodiments. FIG. 11B illustrates an on-state of the pixels in the display apparatus of FIG. 11A. In FIG. 11B, a dotted line indicates pixels in an off-state, and a solid line indicates pixels in an on-state.

Referring to FIG. 11A, the first display area DA1 and the second display area DA2 may include pixels arranged as described with reference to FIG. 7. The first display area DA1 may include a buffer display area BA' relatively adjacent to the second display area DA2 and a normal display area NA' relatively far from the second display area DA2. The blocking metal layer BML may be located in the second display area DA2, and may have the opening BML-OP corresponding to the transmission area TA.

The buffer display area BA' and the normal display area NA' of the first display area DA1 may have the same pixel density. For example, the number of pixels of a first unit U1' in the normal display area NA' of the first display area DA1 may be the same as the number of pixels of a second unit U2' in the buffer display area BA'. The second display area DA2 may include the transmission area TA, and the transmission area TA may be defined by the opening BML-OP of the blocking metal layer BML.

The number of pixels of a third unit U3' in the second display area DA2 may be less than the number of pixels of the first unit U1' and the second unit U2. The first unit U1', the second unit U2', and the third unit U3' have the same area.

A display apparatus having an arrangement of pixels of FIG. 11A may operate as shown in FIG. 11B, and all of pixels of the normal display area NA' of the first display area DA1 may be turned on whereas only some of pixels of the buffer display area BA' may be turned on. In this case, an aperture ratio of pixels of the buffer display area BA may be less than an aperture ratio of pixels of the first display area DA1 and may be greater than an aperture ratio of pixels of the second display area DA2 as shown in FIG. 11B. Accordingly, the visibility or recognition of a boundary portion due to an aperture ratio difference between pixels of the first display area DA1 and the second display area DA2 may be prevented or reduced.

Figure 12A:
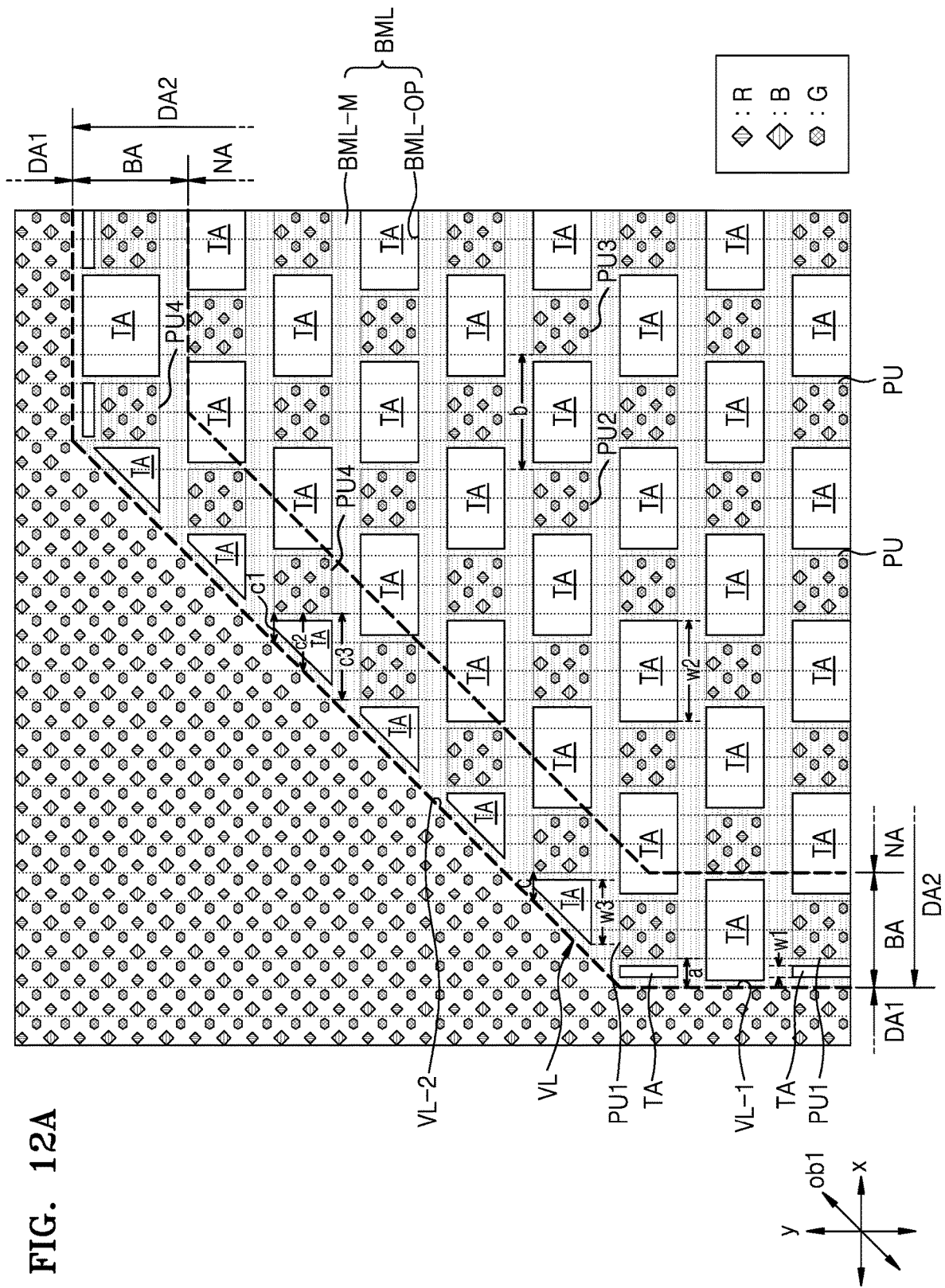
FIGS. 12A and 12B are plan views each illustrating a first display area and a second display area of a display apparatus according to some example embodiments.
Figure 12B:
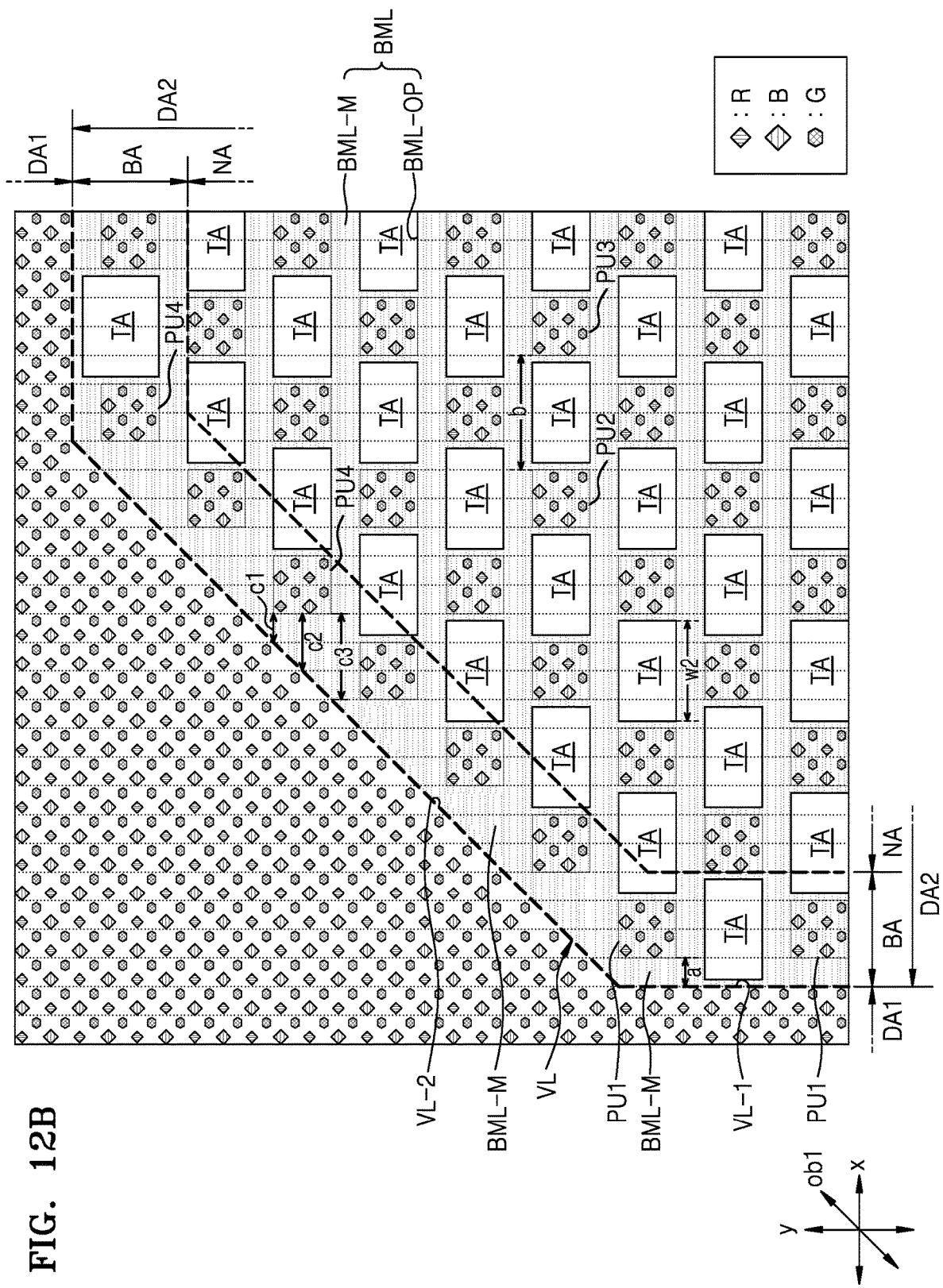

FIGS. 12A and 12B are plan views each illustrating a first display area and a second display area of a display apparatus according to some example embodiments.

Referring to FIG. 12A, the first display area DA1 and the second display area DA2 may be located adjacent to each other, and the second display area DA2 may include the buffer display area BA and the normal display area NA. The first display area DA1 and the second display area DA2 may include pixels, for example, the red pixels R, the green pixels G, and the blue pixels B, and the second display area DA2 may include the transmission area TA.

Pixels of the second display area DA2 may include the pixel groups PU that are spaced apart from one another, and each pixel group PU may include a plurality of pixels arranged in a certain pattern. The transmission area TA may be located between adjacent pixel groups PU. The transmission area TA may be located between the first display area DA1 and the pixel group PU of the second display area DA2 closest to the first display area DA1. For example, the transmission area TA may be located between a first pixel group PU1 and the first display area DA1, may be located between a second pixel group PU2 and a third pixel group PU3, and/or between a fourth pixel group PU4 and the first display area DA1 as shown in FIG. 12A.

The second display area DA2 includes the transmission area TA and thus a boundary between the first display area DA1 and the second display area DA2 having different pixel densities may be unintentionally recognized by a user. According to some example embodiments, however, the visibility or recognition of the boundary between the first display area DA1 and the second display area DA2 may be prevented or reduced by adjusting an arrangement of pixels of the buffer display area BA and/or adjusting a width of the transmission area TA. Because the transmission area TA may be defined by the opening BML-OP of the blocking metal layer BML as described above, the problem that a boundary portion is recognized may be solved by adjusting a width of the opening BML-OP of the blocking metal layer BML.

A distance in a first direction (e.g., the x-direction) between the first display area DA1 and the pixel group PU of the buffer display area BA closest to the first display area DA1 may be less than a distance between two adjacent pixel groups PU of the normal display area NA. According to some example embodiments, a boundary line (virtual boundary line) VL between the first display area DA1 and the second display area DA2 may include a first portion VL-1 extending in a second direction (e.g., the y-direction) as shown in FIG. 12A. The buffer display area BA may include the first pixel group PU1 located adjacent to the first portion VL-1 of the boundary line VL. The first pixel group PU1 may be spaced apart by a first distance "a" in the first direction (e.g., the x-direction) from the first display area DA1. The first distance a may be less than a second distance b between the second pixel group UP2 and the third pixel group PU3 located in the normal display area NA and adjacent to each other. For example, the first distance a may be about ¼ of the second distance b.

The second display area DA2 may include the transmission area TA, and the display apparatus may include the blocking metal layer BML having the opening BML-OP corresponding to the transmission area TA. The blocking metal layer BML may include the metal material portion BML-M overlapping pixels and the opening BML-OP overlapping the transmission area TA.

According to some example embodiments, the transmission area TA may be located between the first pixel group PU1 and the first display area DA1, and the transmission area TA between the first pixel group PU1 and the first display area DA1 may have a first width w1. In some example embodiments, when the transmission area TA between the first pixel group PU1 and the first display area DA1 has the first width w1, it may mean that the opening BML-OP located between the first pixel group PU1 and the first display area DA1 from among a plurality of openings BML-OP of the blocking metal layer BML has the first width w1. The first width w1 is a value in the first direction (e.g., the x-direction), and may be equal to or less than the first distance a.

The first width w1 may be less than a second width w2 of the transmission area TA located between the second pixel group PU2 and the third pixel group PU3 located in the normal display area NA and adjacent to each other. In some example embodiments, when the transmission area TA located between the second pixel group PU2 and the third pixel group PU3 located in the normal display area NA and adjacent to each other has the second width w2, it may mean that the opening BML-OP located between the second pixel group PU2 and the third pixel group PU3 from among the plurality of openings BML-OP of the blocking metal layer BML located in the normal display area NA has the second width w2. The second width w2 may be measured in the same direction as that of the first width w1, for example, in the first direction (e.g., the x-direction). The second pixel group PU2 and the third pixel group PU3 in the normal display area NA may be spaced apart by the second distance b from each other, and the second width w2 may be equal to or less than that of the second distance b.

The boundary line VL between the first display area DA1 and the second display area DA2 may include a second portion VL-2 extending in a first diagonal direction ob1 oblique to the x-direction and the y-direction as shown in FIG. 12A, and the buffer display area BA may include the fourth pixel group PU4 located adjacent to the second portion VL-2 of the boundary line VL. The fourth pixel group PU4 may be spaced apart by a third distance c in the first direction (for example, the x-direction) from the first display area DA1.

When the second portion VL-2 of the boundary line VL extends in the first diagonal direction ob1, the third distance c between the fourth pixel group PU4 and the first display area DA1 may vary according to a measurement point. For example, according to a measurement point, the fourth pixel group PU4 may be spaced apart by a third-first distance c1, may be spaced apart by a third-second distance c2, or may be spaced apart by a third-third distance c3, from the first display area DA1. Each of the third-first distance c1, the third-second distance c2, and the third-third distance c3 is less than the second distance b.

For example, the third-first distance c1 may correspond to about ¼ of the second distance b, the third-second distance c2 may correspond to about ⅖ of the second distance b, and the third-third distance c3 may correspond to about ¾ of the second distance b. The third distance c may indicate a maximum distance between the fourth pixel PU4 and the first display area DA1. For example, the third distance c may indicate the third-third distance c3. Each of the first distance a, the second distance b, the third distance c, the third-first distance c1, the third-second distance c2, and the third-third distance c3 is distinguished from a distance between two adjacent pixels, and is greater than a distance between adjacent pixels.

The transmission area TA may be located between the fourth pixel group PU4 and the first display area DA1, and the transmission area TA between the fourth pixel group PU4 and the first display area DA1 may have a third width w3. In some example embodiments, when the transmission area TA between the fourth pixel group PU4 and the first display area DA1 has the third width w3, it may mean that the opening BML-OP located between the fourth pixel group PU4 and the first display area DA1 from among the plurality of openings BML-OP of the blocking metal layer BML has the third width w3. The third width w3 may be measured in the same direction as that of the width w1 and/or the second width w2, for example, in the first direction (e.g., the x-direction).

When the second portion VL-2 of the boundary line VL extends in the first diagonal direction ob1, the transmission area TA between the fourth pixel group PU4 and the first display area DA1 may have a substantially triangular shape. The third width w3 of the transmission area TA in the first direction (e.g., the x-direction) may vary according to a measurement point. In this case, the third width w3 may indicate a maximum width of the transmission area TA, and a maximum value of the third width w3 may be equal to or less than the third-third distance c3 that is a maximum value of the third distance c.

Although the transmission area TA and/or the opening BML-OP having the first width w1 or the third width w3 is located between the first display area DA1 and an outermost pixel group (e.g., the first pixel group PU1 or the fourth pixel group PU4) of the buffer display area BA in FIG. 12A, the present disclosure is not limited thereto.

In some example embodiments, there may be no transmission area between the first display area DA1 and a pixel group of the buffer display area BA closest to the first display area DA1 as shown in FIG. 12B. For example, there may be no transmission area between the first display area DA1 and the first pixel group PU1 and between the first display area DA1 and the fourth pixel group PU4. A portion between the first display area DA1 and the first pixel group PU1 and a portion between the first display area DA1 and the fourth pixel group PU4 may be covered by or may overlap the metal material portion BML-M of the blocking metal layer BML.

Figure 13A:
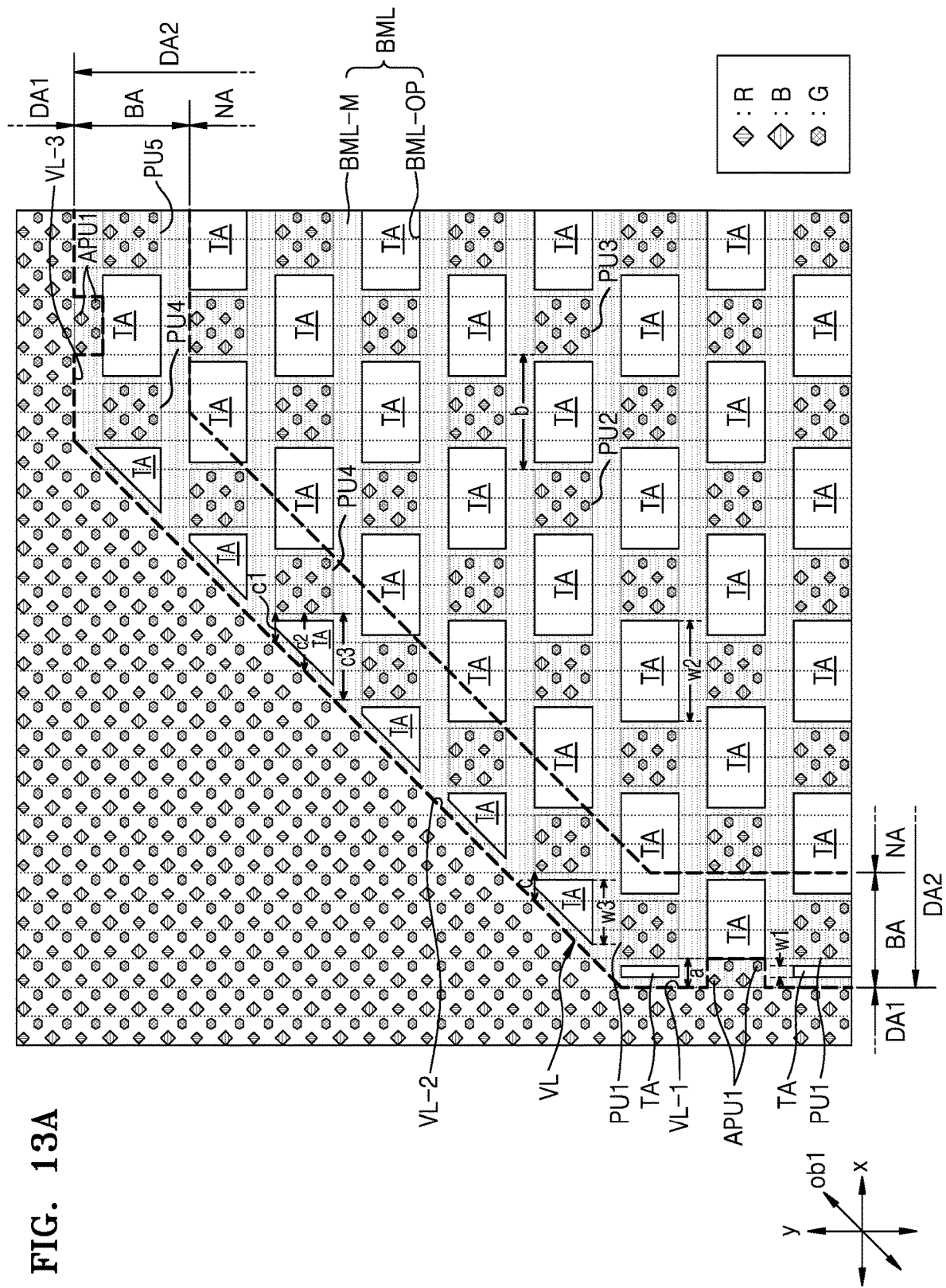
FIGS. 13A and 13B are plan views each illustrating a first display area and a second display area of a display apparatus according to some example embodiments.
Figure 13B:
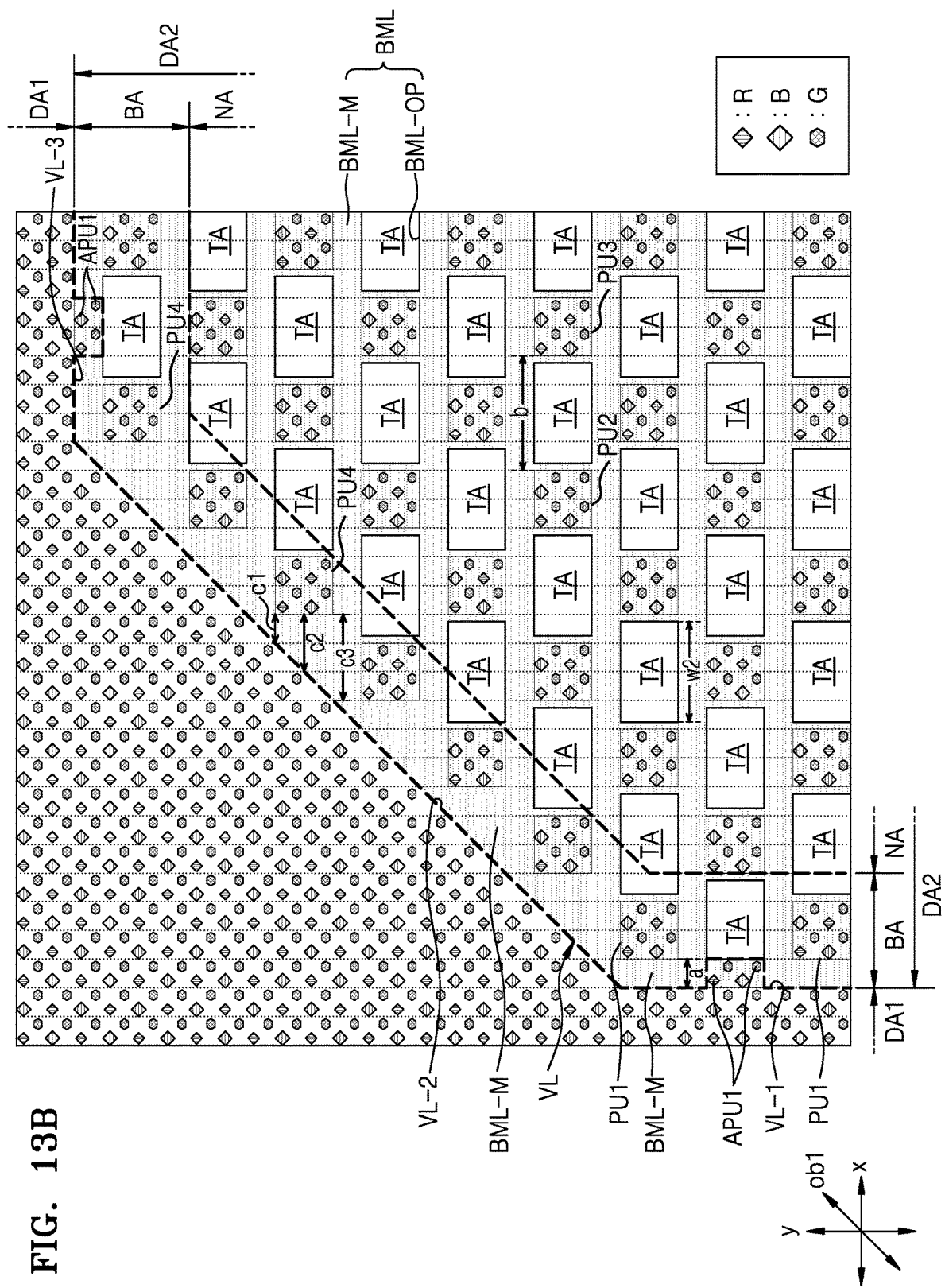

FIGS. 13A and 13B are plan views each illustrating a first display area and a second display area of a display apparatus according to some example embodiments. The display apparatus of FIG. 13A may include features described with reference to FIG. 12A, for example, a relationship among the first through third widths w1, w2, and w3 and a relationship among the first through third distances a, b, and c. The display apparatus of FIG. 13A is different from the display apparatus of FIG. 12A in that the first display area DA1 includes more pixels in a portion adjacent to the second display area DA2. The following will focus on a difference, for convenience of explanation.

Referring to FIG. 13A, the boundary line VL between the first display area DA1 and the second display area DA2 may have a zigzag or serpentine configuration. For example, the first portion VL-1 of the boundary line VL may generally extend in the second direction (e.g., the y-direction), and may locally have a zigzag or serpentine configuration. Likewise, a third portion VL-3 of the boundary line VL may generally extend in the first direction (e.g., the x-direction), and may locally have a zigzag or serpentine configuration.

Pixels of the first display area DA1 located adjacent to the second display area DA2 may be arranged to have a zigzag or serpentine configuration in a plan view (e.g., a view normal or perpendicular to a primary plane or display surface of the electronic device 1). According to some example embodiments, the first display area DA1 may include first pixels APU1 located between two first pixel groups PU1 closest to the first portion VL-1 of the boundary line VL and arranged in the y direction. Likewise, the first display area DA1 may include first pixels APU1 located between two pixel groups, for example, the fourth pixel group PU4 and a fifth pixel group PU5, closest to the third portion VL-3 of the boundary line VL and arranged in the x-direction.

Although the transmission area TA and/or the opening BML-OP having the first width w1 or the third width w3 is located between the first display area DA1 and an outermost pixel group (e.g., the first pixel group PU1 or the fourth pixel group PU4) of the buffer display area BA in FIG. 13A, the present disclosure is not limited thereto.

In some example embodiments, there may be no transmission area between the first display area DA1 and a pixel group of the buffer display area BA closest to the first display area DA1 as shown in FIG. 13B. For example, there may be no transmission area between the first display area DA1 and the first pixel group PU1 and between the first display area DA1 and the fourth pixel group PU4. A portion between the first display area DA1 and the first pixel group PU1 and a portion between the first display area DA1 and the fourth pixel group PU4 may be covered by or may overlap the metal material portion BML-M of the blocking metal layer BML.

FIGS. 14A, 14B, 15A, and 15B are plan views each illustrating a first display area and a second display area of a display apparatus according to some example embodiments.

The display apparatus of FIGS. 14A and 15A may include features described with reference to FIG. 12A, for example, a relationship among the first through third widths w1, w2, and w3 and a relationship among the first through third distances a, b, and c. The display apparatus of FIGS. 14A and 15A may include features described with reference to FIG. 13A. The display apparatus of FIGS. 14A and 15A is different from the display apparatus of FIG. 13A in that the first display area DA1 includes more pixels in a portion adjacent to the second display area DA2.

Figure 14A:
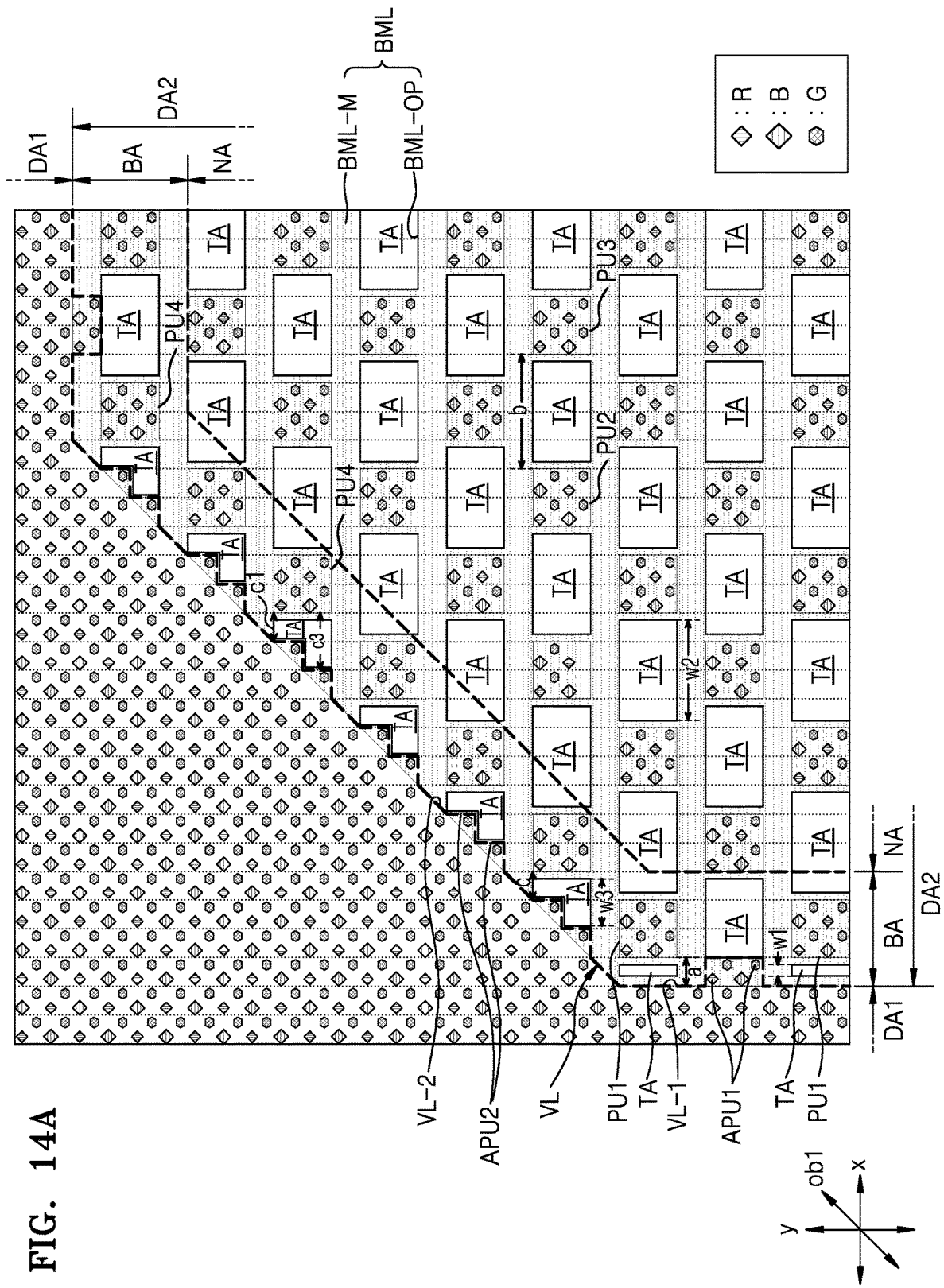
FIGS. 14A and 14B are plan views each illustrating a first display area and a second display area of a display apparatus according to some example embodiments.
Figure 15A:
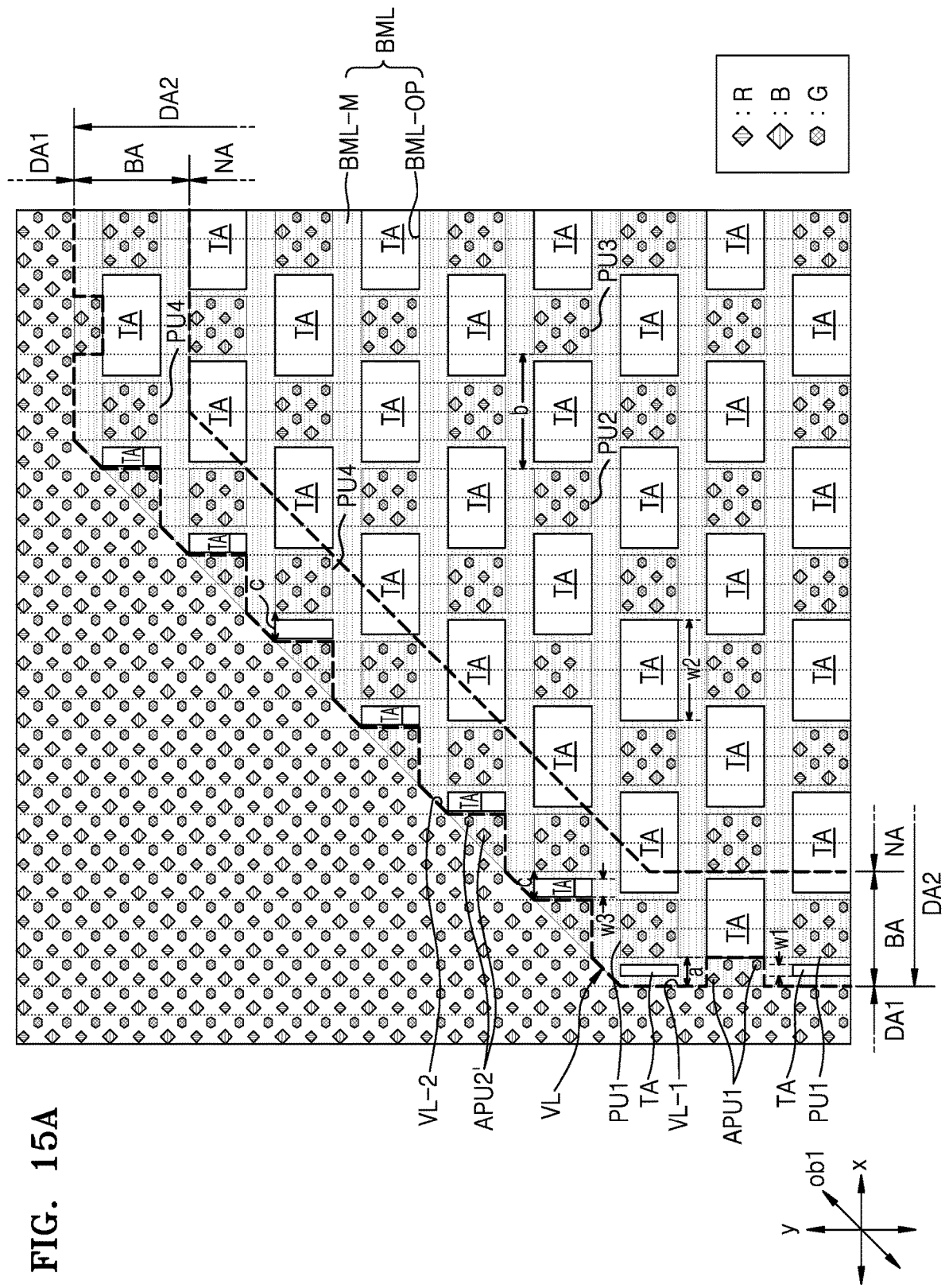
FIGS. 15A and 15B are plan views each illustrating a first display area and a second display area of a display apparatus according to some example embodiments.

Referring to FIGS. 14A and 15A, the boundary line VL between the first display area DA1 and the second display area DA2 may have a zigzag or serpentine configuration, e.g., a stepped (stepwise) configuration. The second portion VL-2 of the boundary line VL may generally extend in the first diagonal direction (e.g., ob1), and may locally have a stepped configuration.

Pixels of the first display area DA1 located adjacent to the second display area DA2 may be arranged to have a stepped configuration. The first display area DA1 may include pixels APU2 (see FIG. 14A) and APU2' (see FIG. 15A) located between two first pixel groups PU1 closest to the second portion VL-2 of the boundary line VL, and the pixels APU2 and APU2' may be arranged in a stepped configuration.

Due to the pixels APU2 and APU2' of the first display area DA1 adjacent to the second portion VL-2 of the boundary line VL, the transmission area TA between the first display area DA1 and the fourth pixel group PU4 of the buffer display area BA closest to the first display area DA1 may have a substantially L-shape as shown in FIG. 14A or may have a substantially I-shape as shown in FIG. 15A. In some example embodiments, when the transmission area TA adjacent to the second portion VL-2 of the boundary line VL has a substantially L-shape or a substantially I-shape, it may mean that the opening BML-OP adjacent to the second portion VL-2 of the boundary line VL from among the openings BML-OP of the blocking metal layer BML has a substantially L-shape or a substantially I-shape.

The third width w3 of the transmission area TA in the first direction (e.g., the x-direction) between the first display area DA1 and the fourth pixel group PU4 may be less than the second width w2 of the transmission area TA between the second and third pixel groups PU2 and PU3 located in the normal display area NA as described above.

In some example embodiments, as shown in FIG. 14A, when the third width w3 of the transmission area TA in the first direction (e.g., the x-direction) varies according to a measurement point, the third width w3 of the transmission area TA located between the first display area DA1 and the fourth pixel group PU4 may indicate a maximum width, and a maximum value of the third width w3 may be equal to or less than the third-third distance c3 that is a maximum value of the third distance c between the first display area DA1 and the fourth pixel group PU4. For example, the third width w3 may be equal to or less than ⅔ of the second distance b.

In some example embodiments, as shown in FIG. 15A, the transmission area TA between the first display area DA1 and the fourth pixel group PU4 may have a shape having a constant width in the first direction (e.g., the x-direction). For example, the third width w3 of the transmission area TA located between the first display area DA1 and the fourth pixel group PU4 may be equal to or less than ¼ of the second distance b.

Although the transmission area TA and/or the opening BML-OP having the first width w1 or the third width w3 is located between the first display area DA1 and an outermost pixel group (e.g., the first pixel group PU1 or the fourth pixel group PU4) of the buffer display area BA in FIGS. 14A and 15A, the present disclosure is not limited thereto.

Figure 14B:
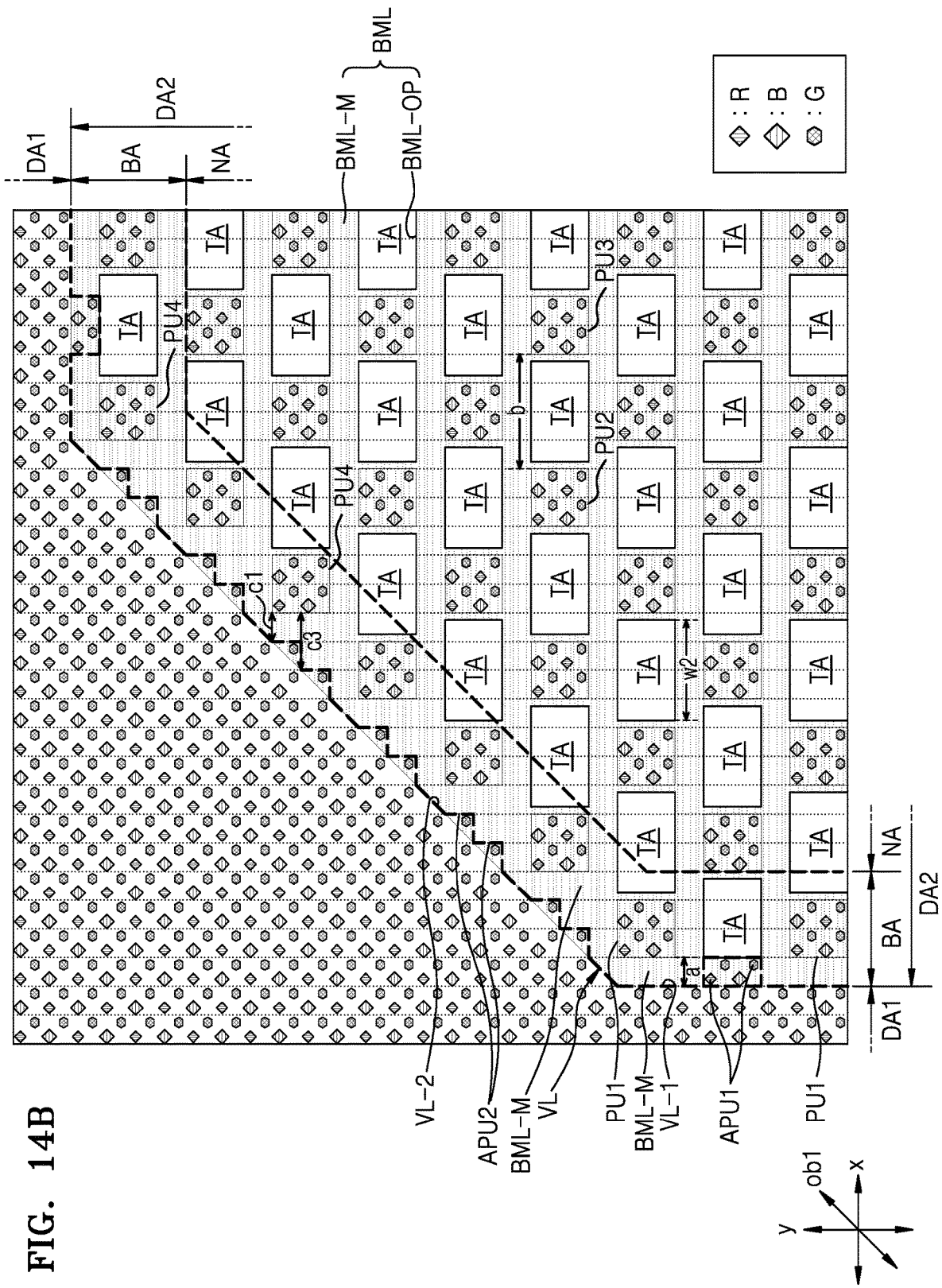
Figure 15B:
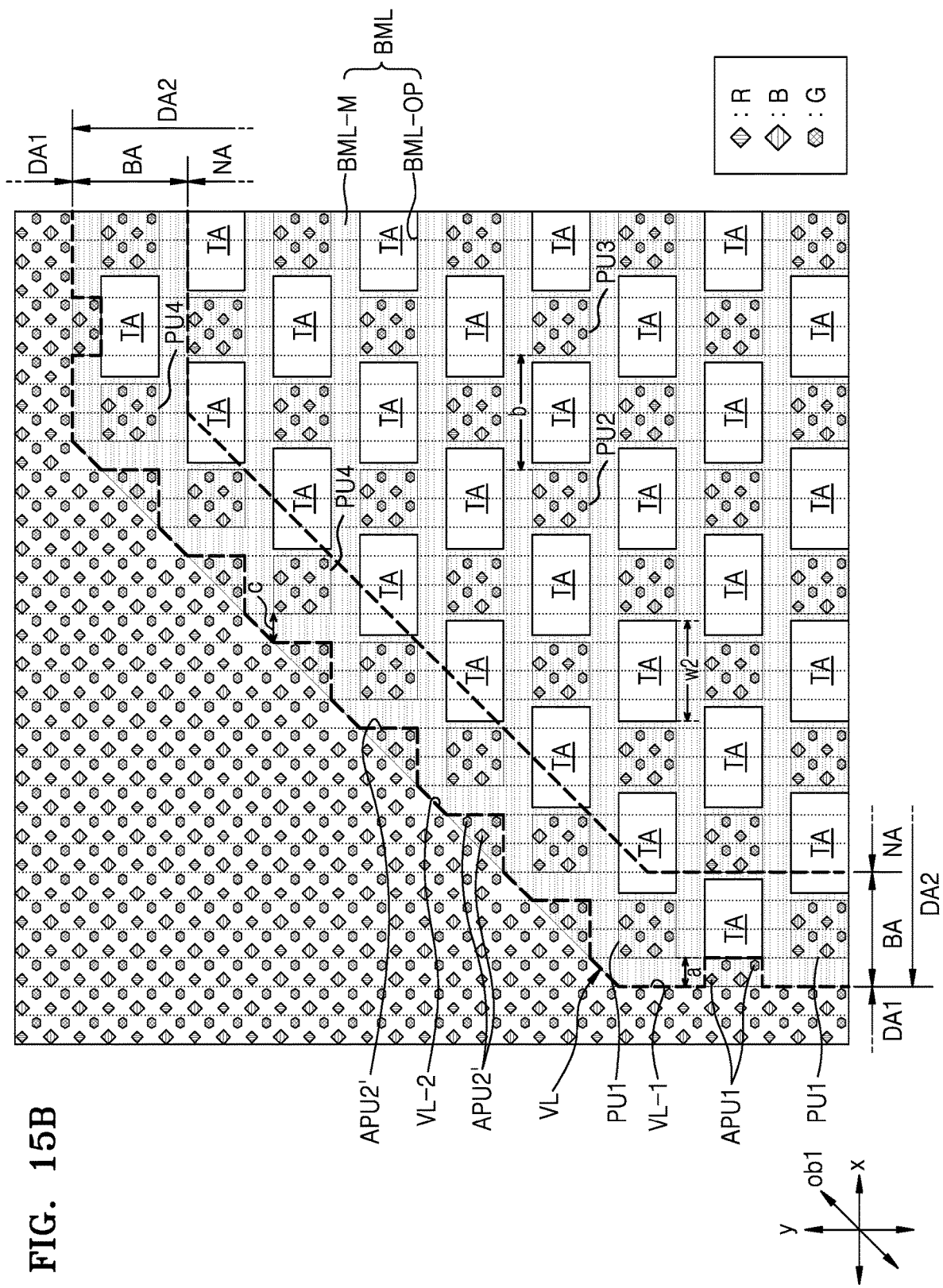

In some example embodiments, there may be no transmission area between the first display area DA1 and a pixel group of the buffer display area BA closest to the first display area DA1 as shown in FIGS. 14B and 15B. For example, there may be no transmission area between the first display area DA1 and the first pixel group PU1 and between the first display area DA1 and the fourth pixel group PU4. A portion between the first display area DA1 and the first pixel group PU1 and a portion between the first display area DA1 and the fourth pixel group PU4 may be covered by or may overlap the metal material portion BML-M of the blocking metal layer BML.

Although a shape of the transmission area TA located between the first display area DA1 and the fourth pixel group PU4 from among pixel groups located in the buffer display area BA conforms to a shape of the second portion VL-2 of the boundary line VL in FIGS. 12A, 13A, 14A, and 15A, the present disclosure is not limited thereto. According to some example embodiments, a shape of the transmission area TA located between the first display area DA1 and the fourth pixel group PU4 of the buffer display area BA may not conform to a shape of the second portion VL-2 of the boundary line VL. According to some example embodiments, for example, the second portion VL-2 of the boundary line VL may have a straight-line shape extending in the first diagonal direction ob1, and the transmission area TA adjacent to the second portion VL-2 of the boundary line VL may have a shape as shown in FIG. 14A or 15A.

Although pixels of the second display area DA2 and pixels of the first display area DA1 have the same arrangement (e.g., a diamond PenTile™ type) in FIGS. 12A through 15B, according to some example embodiments, pixels of the second display area DA2 and pixels of the first display area DA1 may have different arrangements.

According to embodiments, the visibility of a boundary portion between the first display area and the second display area may be prevented or reduced.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:
1. A display apparatus comprising:
a first display area comprising a first plurality of pixels;

a second display area comprising transmission areas and a second plurality of pixels that are spaced apart from one another; and a blocking metal layer comprising openings corresponding to the transmission areas, wherein the second display area comprises a buffer display area adjacent to the first display area and a normal display area spaced apart from the first display area, wherein a first distance between the first display area and a first pixel group of the buffer display area closest to the first display area is less than a second distance between a second pixel group and a third pixel group adjacent to each other in the normal display area.

2. The display apparatus of claim 1, wherein the normal display area comprises a first transmission area between the second pixel group and the third pixel group, and the blocking metal layer comprises a first opening corresponding to the first transmission area of the normal display area.

3. The display apparatus of claim 2, wherein the first opening of the blocking metal layer has a first width, and the first width is equal to or less than the second distance.

4. The display apparatus of claim 3, wherein the buffer display area comprises a second transmission area having a second width and is between the first pixel group and the first display area.

5. The display apparatus of claim 4, wherein the blocking metal layer comprises a second opening corresponding to the second transmission area and having a second width, wherein the second width of the second opening is less than the first width of the first opening.

6. The display apparatus of claim 2, wherein the blocking metal layer comprises a metal material portion overlapping a region between the first display area and the first pixel group of the buffer display area.

7. The display apparatus of claim 1, wherein the transmission areas in a plan view have a same shape as the openings of the blocking metal layer corresponding to the transmission areas.

8. A display apparatus comprising:
a first display area comprising a first plurality of pixels; and
a second display area comprising transmission areas and a second plurality of pixels that are spaced apart from one another,
wherein the second display area comprises a buffer display area adjacent to the first display area and a normal display area spaced apart from the first display area,
pixels of the first display area adjacent to the second display area have a zigzag configuration in a plan view, and
a first pixel group of the buffer display area closest to the first display area is spaced apart by a first distance from the first display area.

9. The display apparatus of claim 8, wherein the first distance is less than a second distance between a second pixel group and a third pixel group adjacent to each other in the normal display area.

10. The display apparatus of claim 9, further comprising a blocking metal layer comprising openings corresponding to the transmission areas.

11. The display apparatus of claim 10, wherein the normal display area comprises a first transmission area between the second pixel group and the third pixel group, and the blocking metal layer comprises a first opening corresponding to the first transmission area.

12. The display apparatus of claim 11, wherein the first opening of the blocking metal layer has a first width, and the first width is equal to or less than the second distance.

13. The display apparatus of claim 10, wherein the blocking metal layer comprises a metal material portion overlapping a region between the first display area and the first pixel group.

14. The display apparatus of claim 10, wherein the transmission areas in a plan view have a same shape as the openings of the blocking metal layer corresponding to the transmission areas.

* * * * *